(12) United States Patent
Restaino et al.

(10) Patent No.: US 7,505,856 B2
(45) Date of Patent: *Mar. 17, 2009

(54) BATTERY TEST MODULE

(75) Inventors: Harvey A. Restaino, Palos Park, IL (US); Jamey L. Butteris, Woodridge, IL (US)

(73) Assignee: Midtronics, Inc., Willowbrook, IL (US)

( * ) Notice: Subject to any disclaimer, the term of this patent is extended or adjusted under 35 U.S.C. 154(b) by 234 days.

This patent is subject to a terminal disclaimer.

(21) Appl. No.: 11/143,828

(22) Filed: Jun. 2, 2005

(65) Prior Publication Data

US 2005/0218902 A1  Oct. 6, 2005

Related U.S. Application Data

(63) Continuation-in-part of application No. 10/310,515, filed on Dec. 5, 2002, now Pat. No. 7,039,533, and a continuation-in-part of application No. 10/217,913, filed on Aug. 13, 2002, now Pat. No. 7,058,525, which is a continuation-in-part of application No. 09/880,473, filed on Jun. 13, 2001, now abandoned, which is a continuation-in-part of application No. 09/780,146, filed on Feb. 9, 2001, now abandoned, and a continuation-in-part of application No. 09/544,696, filed on Apr. 7, 2000, now Pat. No. 6,323,650.

(60) Provisional application No. 60/577,345, filed on Jun. 4, 2004, provisional application No. 60/341,902, filed on Dec. 19, 2001, provisional application No. 60/224,092, filed on Aug. 9, 2000, provisional application No. 60/218,878, filed on Jul. 18, 2000, provisional application No. 60/204,345, filed on May 15, 2000, provisional application No. 60/181,854, filed on Feb. 11, 2000, provisional application No. 60/128,366, filed on Apr. 8, 1999.

(51) Int. Cl.
*G01R 31/36* (2006.01)

(52) U.S. Cl. ............... 702/63; 320/163; 324/426; 324/429; 702/64; 702/65; 702/121; 702/188

(58) Field of Classification Search ............ 702/63–65, 702/102, 121, 117, 186–188; 320/106, 150, 320/132, 163; 324/426, 433, 434, 427, 429; 307/10.5; 340/426.1; 429/90
See application file for complete search history.

(56) References Cited

U.S. PATENT DOCUMENTS 2,000,665 A   5/1935   Neal .................. 439/440

(Continued)

FOREIGN PATENT DOCUMENTS

DE   29 26 716 B1   1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—John H Le
(74) *Attorney, Agent, or Firm*—Westman, Champlin & Kelly, P.A.

(57) ABSTRACT

A storage battery includes a battery housing and a plurality of electrochemical cells in the battery housing electrically connected to terminals of the battery. A battery test module is mounted to the battery housing and electrically coupled to the terminals through Kelvin connections. A display or other output is configured to output battery condition information from the battery test module. The battery test module is configured to automatically carry out a battery test when a voltage across the battery falls below a predetermined threshold.

20 Claims, 13 Drawing Sheets

U.S. PATENT DOCUMENTS

| | | | |
|---|---|---|---|
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/427 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,563,628 A * | 1/1986 | Tietz et al. | 320/163 |
| 4,564,798 A | 1/1986 | Young | 320/103 |
| 4,590,430 A * | 5/1986 | Vandenberghe et al. | 324/427 |
| 4,620,767 A | 11/1986 | Woolf | 439/217 |
| 4,633,418 A | 12/1986 | Bishop | 702/63 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,665,379 A * | 5/1987 | Howell et al. | 340/426.21 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,032,825 A | 7/1991 | Kuznicki | 340/636.15 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |

| Patent No. | | Date | Inventor | Class |
|---|---|---|---|---|
| 5,281,920 | A | 1/1994 | Wurst | 324/430 |
| 5,295,078 | A | 3/1994 | Stich et al. | 700/297 |
| 5,298,797 | A | 3/1994 | Redl | 327/387 |
| 5,300,874 | A | 4/1994 | Shimamoto et al. | 320/106 |
| 5,302,902 | A | 4/1994 | Groehl | 324/434 |
| 5,313,152 | A | 5/1994 | Wozniak et al. | 320/118 |
| 5,315,287 | A | 5/1994 | Sol | 340/455 |
| 5,321,626 | A | 6/1994 | Palladino | 702/63 |
| 5,321,627 | A | 6/1994 | Reher | 702/63 |
| 5,323,337 | A | 6/1994 | Wilson et al. | 702/73 |
| 5,325,041 | A | 6/1994 | Briggs | 320/149 |
| 5,331,268 | A | 7/1994 | Patino et al. | 320/158 |
| 5,336,993 | A | 8/1994 | Thomas et al. | 324/158.1 |
| 5,338,515 | A | 8/1994 | Dalla Betta et al. | 422/95 |
| 5,339,018 | A | 8/1994 | Brokaw | 320/147 |
| 5,343,380 | A | 8/1994 | Champlin | 363/46 |
| 5,347,163 | A | 9/1994 | Yoshimura | 307/66 |
| 5,352,968 | A | 10/1994 | Reni et al. | 320/136 |
| 5,357,519 | A | 10/1994 | Martin et al. | 371/15.1 |
| 5,365,160 | A | 11/1994 | Leppo et al. | 320/160 |
| 5,365,453 | A | 11/1994 | Startup et al. | 702/36 |
| 5,369,364 | A | 11/1994 | Renirie et al. | 324/430 |
| 5,381,096 | A | 1/1995 | Hirzel | 324/427 |
| 5,410,754 | A | 4/1995 | Klotzbach et al. | 370/466 |
| 5,412,308 | A | 5/1995 | Brown | 323/267 |
| 5,412,323 | A | 5/1995 | Kato et al. | 324/429 |
| 5,426,371 | A | 6/1995 | Salley et al. | 324/429 |
| 5,426,416 | A | 6/1995 | Jefferies et al. | 340/664 |
| 5,432,025 | A | 7/1995 | Cox | 429/65 |
| 5,432,426 | A | 7/1995 | Yoshida | 320/160 |
| 5,434,495 | A | 7/1995 | Toko | 320/135 |
| 5,435,185 | A | 7/1995 | Eagan | 73/587 |
| 5,442,274 | A | 8/1995 | Tamai | 320/146 |
| 5,445,026 | A | 8/1995 | Eagan | 73/591 |
| 5,449,996 | A | 9/1995 | Matsumoto et al. | 320/148 |
| 5,449,997 | A | 9/1995 | Gilmore et al. | 320/148 |
| 5,451,881 | A | 9/1995 | Finger | 324/433 |
| 5,453,027 | A | 9/1995 | Buell et al. | 439/433 |
| 5,457,377 | A | 10/1995 | Jonsson | 324/430 |
| 5,469,043 | A | 11/1995 | Cherng et al. | 320/161 |
| 5,485,090 | A | 1/1996 | Stephens | 324/433 |
| 5,488,300 | A | 1/1996 | Jamieson | 324/432 |
| 5,519,383 | A | 5/1996 | De La Rosa | 340/636.15 |
| 5,528,148 | A | 6/1996 | Rogers | 320/149 |
| 5,537,967 | A | 7/1996 | Tashiro et al. | 123/192.1 |
| 5,541,489 | A | 7/1996 | Dunstan | 320/134 |
| 5,546,317 | A | 8/1996 | Andrieu | 702/63 |
| 5,548,273 | A | 8/1996 | Nicol et al. | 340/439 |
| 5,550,485 | A | 8/1996 | Falk | 324/772 |
| 5,552,641 | A * | 9/1996 | Fischer et al. | 307/10.5 |
| 5,561,380 | A | 10/1996 | Sway-Tin et al. | 324/509 |
| 5,562,501 | A | 10/1996 | Kinoshita et al. | 439/852 |
| 5,563,496 | A | 10/1996 | McClure | 320/128 |
| 5,572,136 | A | 11/1996 | Champlin | 324/426 |
| 5,574,355 | A | 11/1996 | McShane et al. | 320/161 |
| 5,578,915 | A | 11/1996 | Crouch, Jr. et al. | 324/428 |
| 5,583,416 | A | 12/1996 | Klang | 320/160 |
| 5,585,728 | A | 12/1996 | Champlin | 324/427 |
| 5,589,757 | A | 12/1996 | Klang | 320/160 |
| 5,592,093 | A | 1/1997 | Klingbiel | 324/426 |
| 5,592,094 | A | 1/1997 | Ichikawa | 324/427 |
| 5,596,260 | A | 1/1997 | Moravec et al. | 320/135 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/106 |
| 5,614,788 | A | 3/1997 | Mullins et al. | 315/82 |
| 5,621,298 | A | 4/1997 | Harvey | 320/134 |
| 5,633,985 | A | 5/1997 | Severson et al. | 704/267 |
| 5,637,978 | A | 6/1997 | Kellett et al. | 320/104 |
| 5,642,031 | A | 6/1997 | Brotto | 320/156 |
| 5,650,937 | A | 7/1997 | Bounaga | 702/65 |
| 5,652,501 | A | 7/1997 | McClure et al. | 340/636.15 |
| 5,653,659 | A | 8/1997 | Kunibe et al. | 477/111 |
| 5,654,623 | A | 8/1997 | Shiga et al. | 320/106 |
| 5,656,920 | A | 8/1997 | Cherng et al. | 324/431 |
| 5,661,368 | A | 8/1997 | Deol et al. | 315/82 |
| 5,675,234 | A | 10/1997 | Greene | 340/636.11 |
| 5,677,077 | A | 10/1997 | Faulk | 429/90 |
| 5,699,050 | A | 12/1997 | Kanazawa | 340/636.13 |
| 5,701,089 | A | 12/1997 | Perkins | 324/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/116 |
| 5,711,648 | A | 1/1998 | Hammerslag | 414/800 |
| 5,717,336 | A | 2/1998 | Basell et al. | 324/430 |
| 5,717,937 | A | 2/1998 | Fritz | 713/300 |
| 5,721,688 | A * | 2/1998 | Bramwell | 702/63 |
| 5,739,667 | A | 4/1998 | Matsuda et al. | 320/128 |
| 5,744,962 | A * | 4/1998 | Alber et al. | 324/426 |
| 5,745,044 | A | 4/1998 | Hyatt, Jr. et al. | 340/5.23 |
| 5,747,909 | A | 5/1998 | Syverson et al. | 310/156.56 |
| 5,747,967 | A | 5/1998 | Muljadi et al. | 320/148 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,978 | A | 6/1998 | Becker | 324/430 |
| 5,780,974 | A | 7/1998 | Pabla et al. | 315/82 |
| 5,780,980 | A | 7/1998 | Naito | 318/139 |
| 5,789,899 | A | 8/1998 | van Phuoc et al. | 320/112 |
| 5,793,359 | A | 8/1998 | Ushikubo | 345/169 |
| 5,796,239 | A | 8/1998 | van Phuoc et al. | 320/107 |
| 5,808,469 | A | 9/1998 | Kopera | 324/434 |
| 5,811,979 | A | 9/1998 | Rhein | 324/718 |
| 5,818,234 | A | 10/1998 | McKinnon | 324/433 |
| 5,821,756 | A | 10/1998 | McShane et al. | 324/430 |
| 5,821,757 | A | 10/1998 | Alvarez et al. | 324/434 |
| 5,825,174 | A | 10/1998 | Parker | 324/106 |
| 5,831,435 | A | 11/1998 | Troy | 324/426 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,872,443 | A | 2/1999 | Williamson | 320/160 |
| 5,872,453 | A | 2/1999 | Shimoyama et al. | 324/431 |
| 5,895,440 | A | 4/1999 | Proctor et al. | 702/63 |
| 5,903,154 | A | 5/1999 | Zhang et al. | 324/437 |
| 5,912,534 | A | 6/1999 | Benedict | 315/82 |
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,951,229 | A | 9/1999 | Hammerslag | 414/398 |
| 5,961,561 | A | 10/1999 | Wakefield, II | 701/29 |
| 5,961,604 | A | 10/1999 | Anderson et al. | 709/229 |
| 5,969,625 | A | 10/1999 | Russo | 340/636.19 |
| 5,978,805 | A | 11/1999 | Carson | 707/10 |
| 5,982,138 | A | 11/1999 | Krieger | 320/105 |
| 6,002,238 | A | 12/1999 | Champlin | 320/134 |
| 6,005,759 | A | 12/1999 | Hart et al. | 361/66 |
| 6,008,652 | A | 12/1999 | Theofanopoulos et al. | 324/434 |
| 6,009,369 | A | 12/1999 | Boisvert et al. | 701/99 |
| 6,016,047 | A | 1/2000 | Notten et al. | 320/137 |
| 6,031,354 | A | 2/2000 | Wiley et al. | 320/116 |
| 6,031,368 | A | 2/2000 | Klippel et al. | 324/133 |
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A * | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurle et al. | 320/112 |
| 6,072,300 | A | 6/2000 | Tsuji | 320/116 |

| | | | |
|---|---|---|---|
| 6,081,098 A | 6/2000 | Bertness et al. ............. 320/134 |
| 6,081,109 A | 6/2000 | Seymour et al. ............ 324/127 |
| 6,091,238 A | 7/2000 | McDermott .............. 324/207.2 |
| 6,091,245 A | 7/2000 | Bertness ..................... 324/426 |
| 6,094,033 A | 7/2000 | Ding et al. .................. 320/132 |
| 6,100,670 A | 8/2000 | Levesque ..................... 320/150 |
| 6,104,167 A | 8/2000 | Bertness et al. ............. 320/132 |
| 6,114,834 A | 9/2000 | Parise ......................... 320/109 |
| 6,137,269 A | 10/2000 | Champlin .................... 320/150 |
| 6,140,797 A | 10/2000 | Dunn ......................... 320/105 |
| 6,144,185 A | 11/2000 | Dougherty et al. ........... 320/132 |
| 6,150,793 A | 11/2000 | Lesesky et al. ............... 320/104 |
| 6,158,000 A | 12/2000 | Collins ........................... 713/1 |
| 6,161,640 A | 12/2000 | Yamaguchi ................ 180/65.8 |
| 6,163,156 A | 12/2000 | Bertness ..................... 324/426 |
| 6,167,349 A | 12/2000 | Alvarez ......................... 702/63 |
| 6,172,483 B1 | 1/2001 | Champlin .................... 320/134 |
| 6,172,505 B1 | 1/2001 | Bertness ..................... 324/430 |
| 6,181,545 B1 | 1/2001 | Amatucci et al. ........... 361/502 |
| 6,211,651 B1 | 4/2001 | Nemoto ...................... 320/133 |
| 6,215,275 B1 | 4/2001 | Bean .......................... 320/106 |
| 6,222,342 B1 | 4/2001 | Eggert et al. ................. 320/105 |
| 6,222,369 B1 | 4/2001 | Champlin .................... 324/430 |
| D442,503 S | 5/2001 | Lundbeck et al. ........... D10/77 |
| 6,225,808 B1 | 5/2001 | Varghese et al. ............ 324/426 |
| 6,236,332 B1 | 5/2001 | Conkright et al. ............ 340/3.1 |
| 6,238,253 B1 | 5/2001 | Qualls ......................... 439/759 |
| 6,242,887 B1 | 6/2001 | Burke ......................... 320/104 |
| 6,249,124 B1 | 6/2001 | Bertness ..................... 324/426 |
| 6,250,973 B1 | 6/2001 | Lowery et al. ............... 439/763 |
| 6,254,438 B1 | 7/2001 | Gaunt ......................... 439/755 |
| 6,259,170 B1 | 7/2001 | Limoge et al. ............. 307/10.8 |
| 6,259,254 B1 | 7/2001 | Klang ......................... 324/427 |
| 6,262,563 B1 | 7/2001 | Champlin .................... 320/134 |
| 6,263,268 B1 | 7/2001 | Nathanson ................... 701/29 |
| 6,271,643 B1 | 8/2001 | Becker et al. ................ 320/112 |
| 6,275,008 B1 | 8/2001 | Arai et al. .................... 320/132 |
| 6,294,896 B1 | 9/2001 | Champlin .................... 320/134 |
| 6,294,897 B1 | 9/2001 | Champlin .................... 320/153 |
| 6,304,087 B1 | 10/2001 | Bertness ..................... 324/426 |
| 6,307,349 B1 | 10/2001 | Koenck et al. ............... 320/112 |
| 6,310,481 B2 | 10/2001 | Bertness ..................... 324/430 |
| 6,313,607 B1 | 11/2001 | Champlin .................... 320/132 |
| 6,313,608 B1 | 11/2001 | Varghese et al. ............ 320/132 |
| 6,316,914 B1 | 11/2001 | Bertness ..................... 320/134 |
| 6,323,650 B1 | 11/2001 | Bertness et al. ............. 324/426 |
| 6,329,793 B1 | 12/2001 | Bertness et al. ............. 320/132 |
| 6,331,762 B1 | 12/2001 | Bertness ..................... 320/134 |
| 6,332,113 B1 | 12/2001 | Bertness ....................... 702/63 |
| 6,346,795 B2 | 2/2002 | Haraguchi et al. ........... 320/136 |
| 6,347,958 B1 | 2/2002 | Tsai ............................ 439/488 |
| 6,351,102 B1 | 2/2002 | Troy ........................... 320/139 |
| 6,356,042 B1 | 3/2002 | Kahlon et al. ............... 318/138 |
| 6,359,441 B1 | 3/2002 | Bertness ..................... 324/426 |
| 6,359,442 B1 | 3/2002 | Henningson et al. ........ 324/426 |
| 6,363,303 B1 | 3/2002 | Bertness ....................... 701/29 |
| RE37,677 E | 4/2002 | Irie ............................... 315/83 |
| 6,384,608 B1 | 5/2002 | Namaky ..................... 324/426 |
| 6,388,448 B1 | 5/2002 | Cervas ........................ 324/426 |
| 6,392,414 B2 | 5/2002 | Bertness ..................... 324/429 |
| 6,396,278 B1 | 5/2002 | Makhija ...................... 324/402 |
| 6,411,098 B1 | 6/2002 | Laletin ........................ 324/436 |
| 6,417,669 B1 | 7/2002 | Champlin .................... 324/426 |
| 6,424,157 B1 | 7/2002 | Gollomp et al. ............. 324/430 |
| 6,424,158 B2 | 7/2002 | Klang ......................... 324/433 |
| 6,441,585 B1 | 8/2002 | Bertness ..................... 320/132 |
| 6,445,158 B1 | 9/2002 | Bertness et al. ............. 320/104 |
| 6,449,726 B1 | 9/2002 | Smith ......................... 713/340 |
| 6,456,045 B1 | 9/2002 | Troy et al. ................... 320/139 |
| 6,466,025 B1* | 10/2002 | Klang ......................... 324/429 |
| 6,466,026 B1 | 10/2002 | Champlin .................... 324/430 |
| 6,469,511 B1 | 10/2002 | Vonderhaar et al. ......... 324/425 |
| 6,495,990 B2 | 12/2002 | Champlin .................... 320/132 |
| 6,526,361 B1 | 2/2003 | Jones et al. .................... 702/63 |
| 6,531,848 B1 | 3/2003 | Chitsazan et al. ........... 320/153 |
| 6,534,993 B2 | 3/2003 | Bertness ..................... 324/433 |
| 6,544,078 B2 | 4/2003 | Palmisano et al. .......... 439/762 |
| 6,556,019 B2 | 4/2003 | Bertness ..................... 324/426 |
| 6,566,883 B1 | 5/2003 | Vonderhaar et al. ......... 324/426 |
| 6,570,385 B1 | 5/2003 | Roberts et al. .............. 324/378 |
| 6,577,107 B2 | 6/2003 | Kechmire ................... 320/139 |
| 6,586,941 B2 | 7/2003 | Bertness et al. ............. 324/426 |
| 6,597,150 B1 | 7/2003 | Bertness et al. ............. 320/104 |
| 6,600,815 B1 | 7/2003 | Walding ..................... 379/93.07 |
| 6,618,644 B2 | 9/2003 | Bean .......................... 700/231 |
| 6,621,272 B2 | 9/2003 | Champlin .................... 324/426 |
| 6,623,314 B1 | 9/2003 | Cox et al. .................... 439/759 |
| 6,628,011 B2 | 9/2003 | Droppo et al. ................. 307/43 |
| 6,629,054 B2 | 9/2003 | Makhija et al. ............. 702/113 |
| 6,633,165 B2 | 10/2003 | Bertness ..................... 324/426 |
| 6,667,624 B1 | 12/2003 | Raichle et al. .............. 324/522 |
| 6,679,212 B2 | 1/2004 | Kelling .................... 123/179.28 |
| 6,696,819 B2 | 2/2004 | Bertness ..................... 320/134 |
| 6,707,303 B2 | 3/2004 | Bertness et al. ............. 324/426 |
| 6,737,831 B2 | 5/2004 | Champlin .................... 320/132 |
| 6,759,849 B2 | 7/2004 | Bertness ..................... 324/426 |
| 6,777,945 B2 | 8/2004 | Roberts et al. .............. 324/426 |
| 6,781,382 B2 | 8/2004 | Johnson ...................... 324/426 |
| 6,784,637 B2 | 8/2004 | Raichle et al. .............. 320/107 |
| 6,788,025 B2 | 9/2004 | Bertness et al. ............. 320/104 |
| 6,795,782 B2 | 9/2004 | Bertness et al. ............... 702/63 |
| 6,805,090 B2 | 10/2004 | Bertness et al. ............. 123/198 |
| 6,806,716 B2 | 10/2004 | Bertness et al. ............. 324/426 |
| 6,825,669 B2 | 11/2004 | Raichle et al. .............. 324/426 |
| 6,842,707 B2 | 1/2005 | Raichle et al. ................ 702/62 |
| 6,850,037 B2 | 2/2005 | Bertness ..................... 320/132 |
| 6,871,151 B2 | 3/2005 | Bertness ....................... 702/63 |
| 2002/0010558 A1 | 1/2002 | Bertness et al. ............... 702/63 |
| 2002/0171428 A1 | 11/2002 | Bertness ....................... 702/63 |
| 2002/0176010 A1 | 11/2002 | Wallach et al. .............. 348/362 |
| 2003/0025481 A1 | 2/2003 | Bertness ..................... 324/427 |
| 2003/0036909 A1 | 2/2003 | Kato ........................... 704/275 |
| 2003/0184262 A1 | 10/2003 | Makhija ..................... 320/156 |
| 2003/0184306 A1 | 10/2003 | Bertness et al. ............. 324/426 |
| 2003/0194672 A1 | 10/2003 | Roberts et al. .............. 431/196 |
| 2004/0000590 A1 | 1/2004 | Raichle et al. .......... 235/462.01 |
| 2004/0000893 A1 | 1/2004 | Raichle et al. .............. 320/135 |
| 2004/0002824 A1 | 1/2004 | Raichle et al. ................ 702/63 |
| 2004/0002825 A1 | 1/2004 | Raichle et al. ................ 702/63 |
| 2004/0049361 A1 | 3/2004 | Hamdan et al. ............. 702/115 |
| 2004/0051533 A1 | 3/2004 | Namaky ..................... 324/426 |
| 2004/0054503 A1 | 3/2004 | Namaky ..................... 702/182 |
| 2005/0162172 A1* | 7/2005 | Bertness ..................... 324/426 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |

| | | |
|---|---|---|
| JP | 04095788 | 3/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique For Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

"Alligator Clips with Wire Penetrators" *J.S. Popper, Inc.* product information, downloaded from http://www.jspopper.com/, Jun. 2, 2005.

"#12: LM78S40 Simple Switcher DC to DC Converter", *ITM e-Catalog*, downloaded from http://www.pcbcafe.com, Jun. 2, 2005.

"Simple DC-DC Converts Allows Use of Single Battery", *Electronix Express*, downloaded from http://www.elexp.com/t_dc-dc.htm, Jun. 2, 2005.

"DC-DC Converter Basics", *Power Designers*, downloaded from http://www.powederdesigners.com/InforWeb.design_center/articles/DC-DC/converter.shtm, Jun. 2, 2005.

* cited by examiner

BATTERY TEST MODULE

CROSS REFERENCE TO RELATED APPLICATIONS

The present application claims the benefit of U.S. provisional patent application Ser. No. 60/577,345, filed Jun. 4, 2004 and is a Continuation-In-Part of U.S. patent application Ser. No. 10/310,515, filed Dec. 5, 2002 which claims the benefit of U.S. provisional patent application Ser. No. 60/341,902, filed Dec. 19, 2001 and is a Continuation-In-Part of U.S. patent application Ser. No. 10/217,913, filed Aug. 13, 2002 which is a Continuation-In-Part of U.S. patent application Ser. No. 09/880,473, filed Jun. 13, 2001 which is a Continuation-In-Part of and claims priority of U.S. patent application Ser. No. 09/780,146, filed Feb. 9, 2001 which is based on and claims the benefit of U.S. provisional patent application Ser. No. 60/181,854, filed Feb. 11, 2000; U.S. Provisional patent application Ser. No. 60/204,345, filed May 15, 2000; U.S. provisional patent application Ser. No. 60/218,878, filed Jul. 18, 2000; and U.S. provisional patent application Ser. No. 60/224,092, filed Aug. 9, 2000, and is a Continuation-In-Part of and claims priority of U.S. patent application Ser. No. 09/544,696, filed Apr. 7, 2000, which claims the benefit of priority of U.S. provisional patent application Ser. No. 60/128,366, filed Apr. 8, 1999, the contents of which are hereby incorporated by reference in their entirety.

BACKGROUND OF THE INVENTION

The present invention relates to storage batteries. More specifically, the present invention relates to storage batteries with integral battery testers.

Storage batteries, such as lead acid storage batteries, are used in a variety of applications such as automotive vehicles and standby power sources. Typical storage batteries consist of a plurality of individual storage cells which are electrically connected in series. Each cell can have a voltage potential of about 2.1 volts, for example. By connecting the cells in the series, the voltages of the individual cells are added in a cumulative manner. For example, in a typical automotive storage battery, six storage cells are used to provide a total voltage of about 12.6 volts. The individual cells are held in a housing and the entire assembly is commonly referred to as the "battery."

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In a load test, the battery is discharged using a known load. As the battery is discharged, the voltage across the battery is monitored and used to determine the condition of the battery. More recently, a technique has been pioneered by Dr. Keith S. Champlin and Midtronics, Inc. of Willowbrook, Ill. for testing storage battery by measuring a dynamic parameter of the battery such as the dynamic conductance of the battery. This technique is described in a number of United States Patents and United States Patent Applications, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUN-AWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Ser. No. 09/595,102, filed Jun. 15, 2000, entitled APPARATUS AND METHOD FOR TESTING RECHARGEABLE ENERGY STORAGE BATTERIES; U.S. Ser. No. 09/703,270, filed Oct. 31, 2000, entitled ELECTRONIC BATTERY TESTER; U.S. Ser. No. 09/575,629, filed May 22, 2000, entitled VEHICLE ELECTRICAL SYSTEM TESTER WITH ENCODED OUTPUT; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; U.S. Ser. No. 09/870,410, filed May 30, 2001, entitled INTEGRATED CONDUCTANCE AND LOAD TEST BASED ELECTRONIC BATTERY TESTER; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/876,564, filed Jun. 7, 2001, entitled ELECTRONIC BATTERY TESTER; U.S. Ser. No. 09/878,625, filed Jun. 11, 2001, entitled SUPPRESSING INTERFERENCE IN AC MEASUREMENTS OF CELLS, BATTERIES AND OTHER ELECTRICAL ELEMENTS; U.S. Ser. No. 09/902,492, filed Jul. 10, 2001, entitled APPARATUS AND METHOD FOR CARRYING OUT DIAGNOSTIC TESTS ON BATTERIES AND FOR RAPIDLY CHARGING BATTERIES; and U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, entitled PROGRAMMABLE CURRENT EXCITER FOR MEASURING AC IMMITTANCE OF CELLS AND BATTERIES; U.S. Ser. No. 10/047,923, filed Oct. 23, 2001, entitled AUTOMOTIVE BATTERY CHARGING SYSTEM TESTER, U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 10/042,451, filed Jan. 8, 2002, entitled BATTERY CHARGE CONTROL DEVICE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; which are incorporated herein in their entirety.

In general, battery testers have been separate pieces of equipment which can be moved between storage batteries and electrically coupled to a storage battery. The prior art has lacked a simple technique for the testing of a storage battery without relying on separate testing equipment.

SUMMARY OF THE INVENTION

A storage battery includes a battery housing and a plurality of electrochemical cells in the battery housing electrically connected to terminals of the battery. A battery test module is mounted to the battery housing and electrically coupled to the terminals through Kelvin connections. A display or other output is configured to output battery condition information from the battery test module. In some embodiments, the battery test module is configured to automatically carry out a battery test when a voltage across the battery falls below a predetermined threshold.

BRIEF DESCRIPTION OF THE DRAWINGS

FIGS. 16-1 through 16-3 illustrate different embodiments of fasteners used to couple the battery test module to the battery.

DETAILED DESCRIPTION OF THE PREFERRED EMBODIMENTS

In one aspect of the present invention a storage battery is provided having an integrated battery test module for performing a battery test on electrical cells of the storage battery. As used herein "integrated" can include a separate module which is attached to the battery housing. In one embodiment, the battery test module is electrically coupled to the electrical cells of the storage battery through Kelvin connections. In certain aspects, Kelvin connections are not used. As the battery test module is integral with the battery, an operator can test the battery without relying on external battery test equipment. In one embodiment, the battery test is one that can be easily performed by an unskilled operator. The battery test module is preferably manufactured using low cost techniques which may be integrated with a storage battery without an excessive increase in the cost to produce the battery. Further, the battery test module is capable of outputting battery condition information to an output device that is attached to the battery housing and/or to a separate output that may be at a location that is remote from the storage battery. As used herein, battery condition information can be any information generated by the battery test module or any battery test result obtained by the battery test module. Examples of battery condition information include real-time measurements (such as, battery voltage, current, temperature, etc.) conducted by the test module, intermediate test results and final test results obtained by the battery test module.

Figure 1:
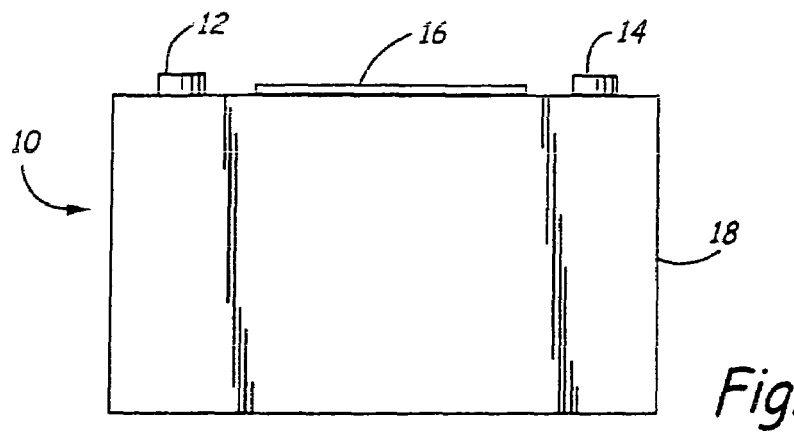
FIG. 1 is a side plan view of a storage battery including a battery test module in accordance with the present invention.

FIG. 1 is a side plan view of a storage battery 10 in accordance with the present invention. Storage battery 10 includes a positive terminal 12 and a negative terminal 14. A battery test module 16 is mounted to a housing 18 of the storage battery.

Figure 2A:
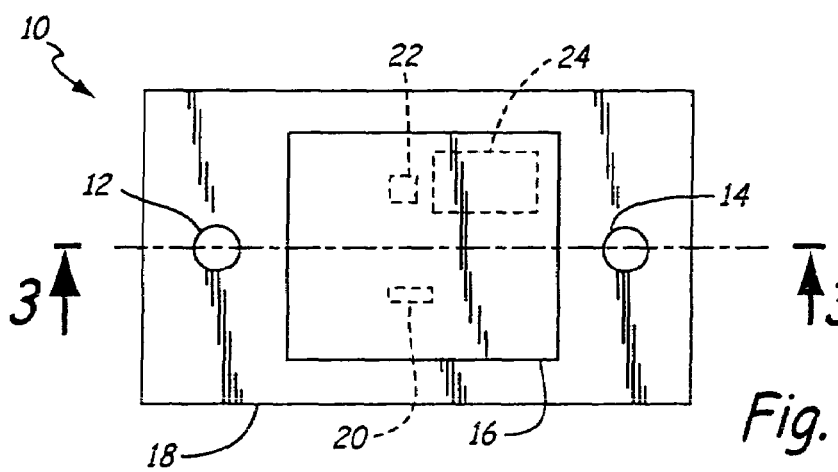
FIGS. 2A and 2B are top plan views of the storage battery of FIG. 1.
Figure 2B:
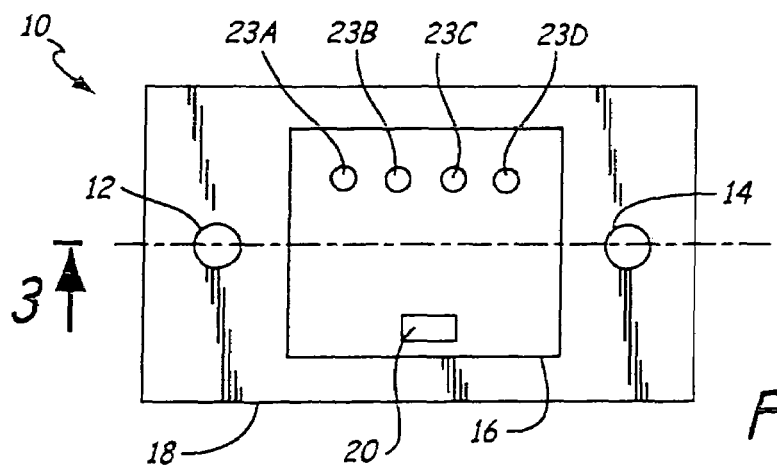

FIGS. 2A and 2B are top plan views of the storage battery 10 of FIG. 1. As illustrated in FIG. 2A, battery test module 16 includes an optional input 20 and optional outputs 22 and 24. Input 20 can be, for example, a push button or other input which can be actuated by an operator or automated by a system. Output 22 can be, for example, an LED or other type of visual indicator which provides a pass/fail indication of a battery test. However, in other aspects, output 24 can be used to send data, using any appropriate technique, to a remote computer or monitoring system. Output 24 can be used to provide a quantitative output of a battery test. In FIG. 2B, the output 22 is in the form of a series of outputs 23A, 23B, 23C and 23D which can comprise LEDs.

Figure 3:
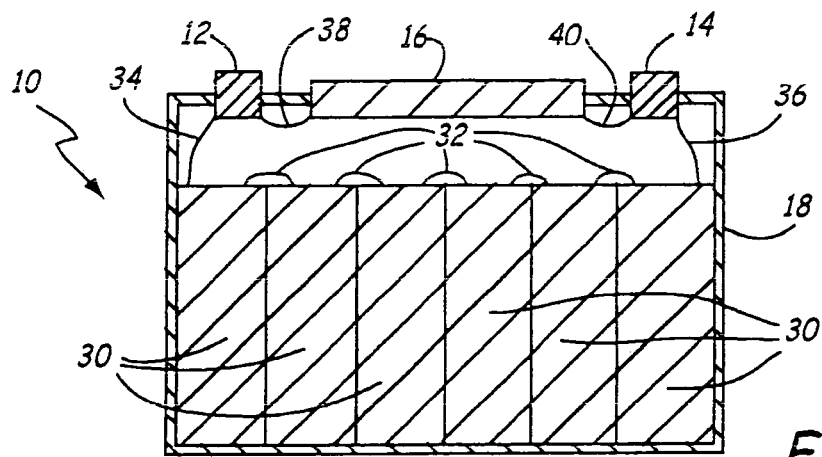
FIG. 3 is a side cross-sectional view of the storage battery of FIGS. 1 and 2 taken along the line labeled 3-3 in FIG. 2.
Figures 1, 16:
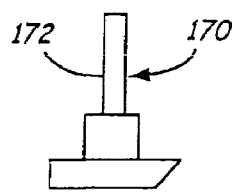
Figures 2, 16:
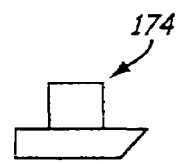
Figures 3, 16:
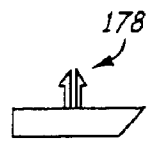

FIG. 3 is a side cross-sectional view of battery 10 taken along the line labeled 3-3 in FIG. 2. As illustrated in FIG. 3, battery 10 is a storage battery such as a lead-acid battery and includes a number of electrochemical cells which are electrically connected in series by conductors 32. This forms a string of cells 30 having one end electrically coupled to positive terminal 12 through conductor 34 and having the other end electrically coupled to negative terminal 14 through conductor 36. As illustrated in FIG. 3, battery test module 16 is coupled to terminals 12 and 14 through two pairs of electrical connections which provide Kelvin connections 38 and 40. The connections to terminals 12 and 14 can be achieved through direct contact with the external battery posts 12 or 14, through battery post extensions tooled, molded or configured to the battery posts 12 or 14, through direct internal or external wiring connections to battery posts 12 or 14, or through a reconfiguration of the battery casing and battery posts 12 or 14.

In operation, a user can test the condition of battery 10 using battery test module 16. For example, through actuation of button 20 or another input device, a test can be performed on the battery. The results of the battery test are displayed on outputs 22 or 24. In one embodiment, battery test module 16 monitors the battery and waits for a period when the battery is not in use or there is not excessive noise on the electrical system to which the battery is connected and then performs a test on the battery. The results of the battery test can be stored in memory and displayed on output 22 or 24. In such an embodiment, an input such as input 20 is not required to activate the test. However, in such an embodiment, the circuitry within test module 16 could cause the battery to discharge over an extended period.

In the embodiment shown in FIG. 2B, battery test module 16 compares the voltage between terminals 12 and 14 to a number of different threshold voltages. Depending upon the voltage of battery 10, an appropriate number of LEDs 23A-D are illuminated on test module 16. For example, each LED can correspond to a different threshold. These thresholds can be spaced as desired. The LEDs 23A-D can also be of different colors. For example, 23A can be a read LED while 23D can be a green LED. In a slightly more complex embodiment, a load, such as a load resistance, in module 16 can be applied to battery 10 during or prior to a voltage measurement. The output of module 16 can be a function of the applied load.

In one embodiment, test module 16 illuminates outputs 23A-D consecutively until the appropriate threshold is reached. To provide a more desirable user-interface, a small delay can be introduced between the illumination of the each LED. The timing can be as appropriate. The results of the battery test can be maintained on outputs 23A-D for a desired length of time, preferably sufficiently long for a user to observe the test result. In one embodiment, the appropriate number of LEDs remain lit until the test is complete. In another embodiment, only a single LED is lit at a time. Of course, any number of LEDs and thresholds may be used. In other embodiments, additional information can be communicated to an operator by flashing LEDs providing a code or a warning.

The circuitry of the battery tester in the embodiment of FIG. 2B can be implemented using simple comparators and timing circuits as will be apparent to those skilled in the art. A more complex embodiment can include a small microprocessor. Typically, the circuitry of battery test module 16 is powered by storage battery 10.

Figure 4:
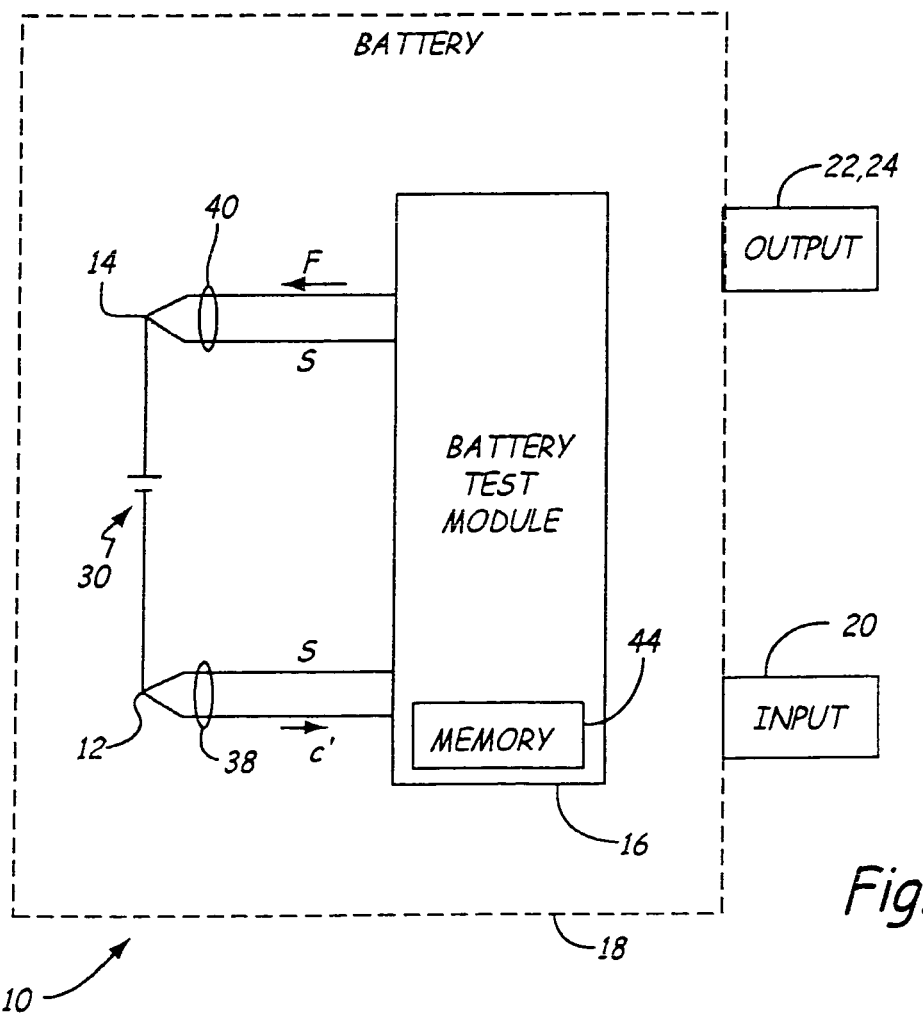
FIG. 4 is a block diagram of a storage battery in accordance with the present invention.

FIG. 4 shows a more detailed view of the electrical connections between battery test module 16 and the cells 30 of the battery 10. Cells 30 are illustrated using the electrical symbol for a battery. Battery test module 16 is coupled to electrochemical cells 30 through Kelvin connections 38 and 40.

A microprocessor in battery test module 16 can store information in memory 44 for later retrieval. For example, information regarding the history of battery usage and battery charging can be maintained in memory for later output. A special access code can be entered through user input 20 to cause the data to be output through output 22 or 24 or other output. In one embodiment, the output can be an audio output such as a series of tones or pre-recorded words. The input can comprise a special series of buttons or timing of pressing of buttons. Alternative inputs can also be provided such as an IR sensor, a vibration sensor, a magnetic switch, a proximity receiver which inductively couples to an external device or others. The output can be provided by energizing an LED in accordance with a digital code which could be read by an external device. Other types of outputs can be provided through an IR link, a proximity communication technique such as inductive coupling, etc. Other techniques include a serial or other hard wired output, RF and optical. Further, a battery test can be initiated based upon an input received through input 20 or 26, using any of the above communication techniques, from a remote computer or other circuitry. This can also be used to initiate a data dump of information stored in memory. Inputs and outputs can also be provided to test module 16 by modulating data onto positive and negative terminals 12 and 14. The data can be received or transmitted using transmit and receive circuitry in battery module 16. Various modulation techniques are known in the art. In one embodiment, the modulation technique is selected such that it does not interfere with external circuitry to which battery 10 may be coupled.

The data recording and reporting technique allows a manufacturer to monitor usage of a battery. For example, the manufacturer could determine that the battery was left in an uncharged condition for an extended period, prior to sale, which caused damage to the battery. The data stored in memory can be keyed to date information if such information is maintained by a microprocessor in battery test module 16 such that various events in the life of the battery 18 can be linked to specific dates. Examples of other information which can be stored in memory 44 include the date of manufacture, battery ratings, battery serial number of other identification, distribution chain, etc.

FIG. 4 also illustrates another aspect of the present invention. In FIG. 4, element 10 can also illustrate a standby jumper or auxiliary system 10 which contains an internal battery 30. Jumper cables or other output such as a cigarette lighter adapter, can couple to battery 30 and can be used to provide auxiliary power to an automotive vehicle. For example, such a system can be used to provide a brief charge to a vehicle or to start a vehicle having a dead battery. This can be used to "jump start" the vehicle. Such devices are known in the art and are typically small, portable devices which contain an internal battery. The internal battery can be, for example, a gel cell, a NICAD battery, a nickel metal hydride battery or other type of battery. One problem with such auxiliary power systems is that the internal battery can fail without the knowledge of the user. When use of the of auxiliary power system is required, the battery may have failed. Further, the type of a failure may be one which is not easily detected in that the battery may provide a normal voltage output but is not capable of supplying a great deal of current for any period of time. With the present invention, system 10 can also include a test module 16 for testing battery 30. In such an embodiment, a user could periodically test battery 30 to ensure it has not failed. Further, test module 16 can periodically test battery 30 and provide a warning indication such as a flashing light or a warning sound if battery 30 fails. In one aspect of the invention, any type of battery tester can be used to test such an auxiliary battery system.

The present invention can be implemented using any appropriate technique. One example is set forth in U.S. Pat. No. 6,172,505, issued Jan. 9, 2001, and entitled ELECTRONIC BATTERY TESTER which is incorporated herein by reference.

In one aspect, the battery test module determines battery condition based upon a dynamic parameter of the battery, that is a measurement of the battery which is made using a time varying forcing function F as shown in FIG. 4. The resultant signals in FIG. 4 can be used to determine the dynamic parameter. Example dynamic parameters include dynamic conductance, resistance, impedance and admittance. In another example, single contacts are used to obtain a measurement across the battery.

Memory such as memory 44 within test module 16 can be used to store battery specific information such as the rating of battery 10. The information can be loaded into permanent memory during manufacture. Thus, the user is not required to enter any information regarding the battery. This information can be used in performing the battery test and to provide a qualitative output to a user.

Output 22 can be any type of output including a visual output. Examples include bi or tri-color LEDs. The color along with a flashing condition of an LED can indicate test results such as good, bad, low charge, too low to test, or other conditions and determinations. A flashing LED can be used to indicate system noise, bad cell, or other conditions and determinations. When the user input 20 is used, the circuitry does not provide any drain on the battery except when activated. However, an input such a switch can increase cost and could allow a user to attempt a test at an inopportune time, such as during periods of high system noise.

In embodiments without input 20, test module 16 can wait for a quiet time or other appropriate time to perform a test. The result can be stored in internal memory and periodically displayed on output 22/24 for a brief period. However, extended operation of the test module can drain the battery. In one embodiment, a start-up circuit can be triggered to 'wake up' the test module when the battery experiences a voltage increase such as that due to charging of the battery. The circuitry can then enter a 'sleep' mode based during period of non-charging in order to save power, for example, shortly after charging stops.

The battery test module of the present invention is preferably integral with the battery. For example, the module can be mounted to the housing such as to a top cover of the housing. In various embodiments, the module can be carried within the housing or within an isolated compartment in the housing. The Kelvin connections can couple to the battery terminals either through external or internal conductors.

Of course, the test circuitry and test module can be attached to the battery through any technique including for example, techniques that do not require any modifications to the battery container. For example, it can attach under bolts used on the battery post or can use a press fit or "trap" configuration to fit over the battery posts. This allows the circuitry to be optionally added to existing batteries.

Further, one aspect of the invention includes any tester that is integral with the battery or substantially permanently attached to the battery that provides an output related to a battery condition such as cold cranking amps (CCA) and/or uses Kelvin connections to couple to the battery.

Figure 5:
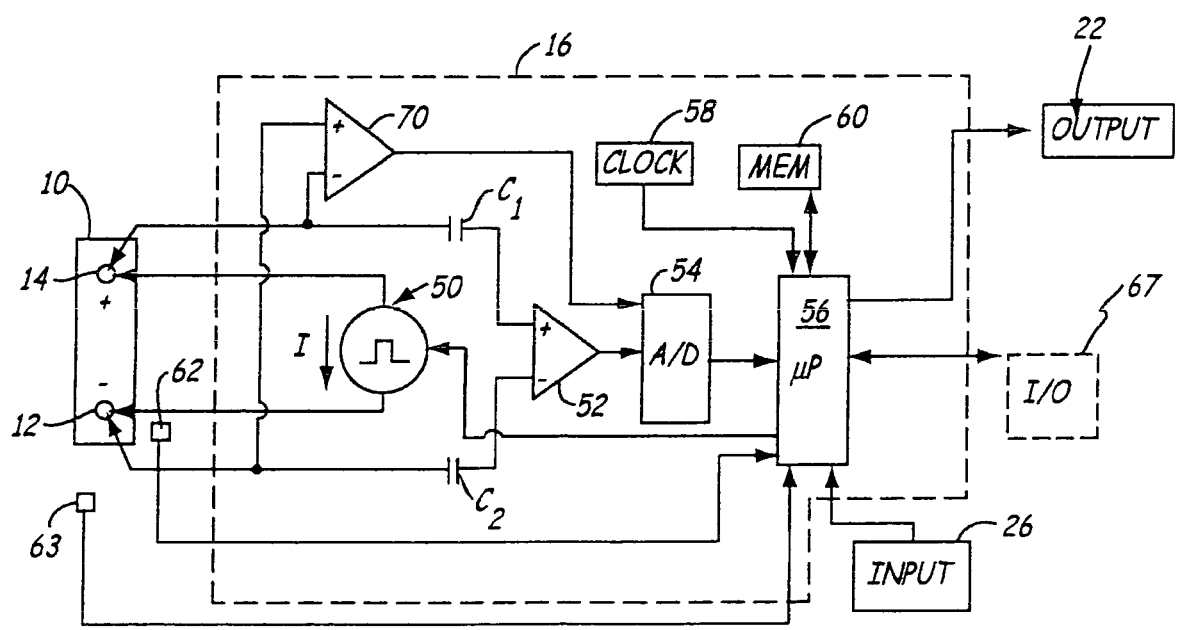
FIG. 5 is an electrical diagram of one example embodiment.

FIG. 5 is a simplified circuit diagram of test module 16. Module 16 is shown coupled to battery 10. Module 16 operates in accordance with one embodiment of the present invention and determines the conductance ($G_{BAT}$) of battery 10 and the voltage potential ($V_{BAT}$) between terminals 12 and 14. Module 16 includes current source 50, differential amplifier 52, analog-to-digital converter 54 and microprocessor 56. Amplifier 52 is capacitively coupled to battery 10 through capacitors $C_1$ and $C_2$. Amplifier 52 has an output connected to an input of analog-to-digital converter 54. Microprocessor 56 is connected to system clock 58, memory 60, visual output 62 and analog-to-digital converter 54. Microprocessor 56 is also capable of receiving an input from input device 26. Further, an input/output (I/O) port 67 is provided.

In operation, current source 50 is controlled by microprocessor 56 and provides a current in the direction shown by the arrow in FIG. 5. In one embodiment, this is a square wave or a pulse. Differential amplifier 52 is connected to terminals 22 and 24 of battery 10 through capacitors $C_1$ and $C_2$, respectively, and provides an output related to the voltage potential difference between terminals 12 and 14. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 10 between terminals 12 and 14. The output of amplifier 70 is provided to analog-to-digital converter 54 such that the voltage across terminals 12 and 14 can be measured by microprocessor 56.

Module 16 is connected to battery 10 through a four-point connection technique known as a Kelvin connection. This Kelvin connection allows current I to be injected into battery 10 through a first pair of terminals while the voltage V across the terminals 12 and 14 is measured by a second pair of connections. Because very little current flows through amplifier 52, the voltage drop across the inputs to amplifier 52 is substantially identical to the voltage drop across terminals 12 and 14 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 10 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 10. Microprocessor 56 calculates the conductance of battery 10 using the following equation:

$$\text{Conductance} = G_{BAT} = \frac{\Delta I}{\Delta V} \qquad \text{Equation 1}$$

where $\Delta I$ is the change in current flowing through battery 10 due to current source 50 and $\Delta V$ is the change in battery voltage due to applied current $\Delta I$. A temperature sensor 62 can be thermally coupled to battery 10 and used to compensate battery measurements. Temperature readings can be stored in memory 60 for later retrieval.

In one embodiment of the present invention, test module 16 includes a current sensor 63 which measures charge/discharge current of the battery. The battery current measurements are utilized by microprocessor 56 to relatively accurately determine state of charge and state of health of battery 10.

Figure 6:
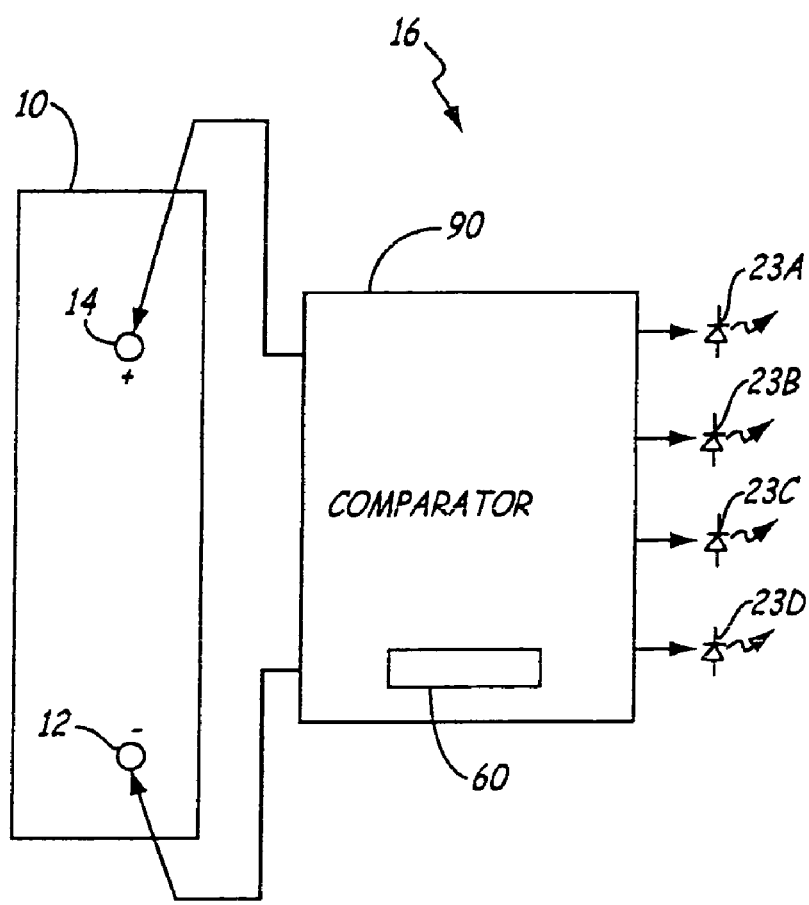
FIG. 6 is an electrical diagram of another example embodiment.

FIG. 6 is a simple diagram for the embodiment of module 16 shown in FIG. 2B. A comparator 90 can periodically compare a voltage measurement to a plurality of reference levels and responsively energize LEDs 23A-D to provide an indication of the condition of battery 10. This display can be provided or be activated by a switch or other condition. Any of the various features set forth in the Figures and discussion can be used in any appropriate combination and should not be limited to the specific examples shown.

In one aspect of the invention, battery test module 16 is advantageously used while manufacturing and/or during delivery of a vehicle. Module 16 can be installed in battery 10 during the vehicle manufacturing process. As the vehicle moves through the assembly line, various loads are placed on the electrical system. For example, the radio may be run, starter actuated, head lights turned on, etc. Module 16 provides an indication if the battery has been discharged, and should be recharged (or should be replaced due to failure or impending failure) prior to delivery to a dealer or sale to a customer. Module 16 provides an output, such as a visual output to indicate that the battery 10 is discharged and should be recharged.

The module 16 can be configured to store information based on the particular type of rating of battery 10. This can be used in the battery test to determine if the battery should be recharged. Module 16 can be removed from the battery 10 once the vehicle has been assembled or delivered. The module 16 can be reconnected and reused on another vehicle in the assembly line.

With various aspects of the invention, including a module used during manufacture or delivery of a vehicle, module 16 can provide a simple pass/fail visual output, for example through colored LED(s). Additional data can be output to other equipment, for example, by coupling to a data bus of the vehicle, through IR, RF, an external data bus or connection, etc. Additional information can be stored for later retrieval such as information related to battery temperature, usage or cycle history, etc. This data can be time or date stamped and used to diagnose common failures which occur during vehicle manufacturing. Additional information can be stored in the memory such as serial numbers, multiple battery characteristics, self learning, etc.

In general, measurements and computations carried out by module 16 can be time or date stamped. Based on this time and date stamped information, module 16 can provide an output related to how long the battery was in an unused condition when installed in a vehicle, how long the battery was on the shelf, how long the battery was in a completely discharged condition, etc.

Figure 7:
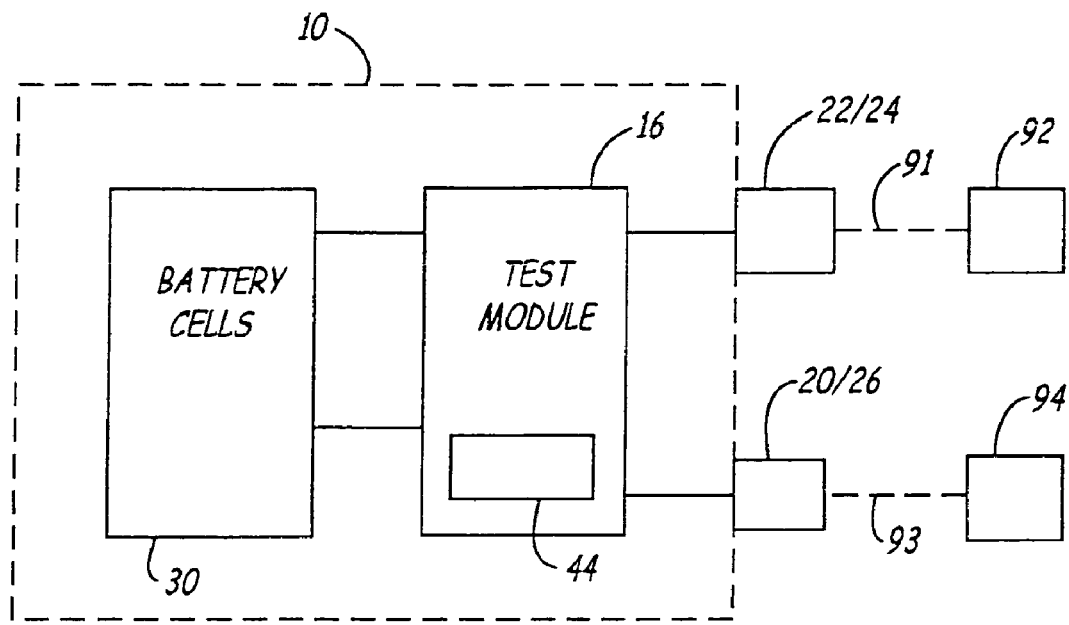
FIG. 7 is a block diagram of a storage battery in accordance with another example embodiment of the present invention.

FIG. 7 illustrates another embodiment of a storage battery in accordance with the present invention. A number of items illustrated in FIG. 7 are similar to those shown in FIGS. 1-6 and are similarly numbered. In addition, FIG. 7 illustrates a remote output 92 and a remote input 94 with which test module 16 can communicate via communication links 91 and 93, respectively. Test module 16 can output battery condition information to output 22/24 and/or to remote output device 92. Remote output device 92 can be any output device such as a gauge, meter, speaker, etc. Remote output device 92 may be located, for example, in a driver cabin or on a dashboard of the vehicle in which storage battery 10 is installed. Remote output device 92 may be an analog output device or a digital output device. Communication link 91 may be any type of communication link, such as a wireless communication link, hard wired communication link, optical communication link, etc. Communication link 91 can also be a vehicle bus such as a Controller Area Network (CAN) bus or a Local Interconnect Network (LIN) bus. Depending upon the type of communication link 91 and type of remote output device 92, test module 16 can provide test condition information in an appropriate form for remote output 92 to receive. Thus, test condition information can be provided in analog form, digital form, in the form of RF signals, IR signals, audio signals, etc. Test module 16 can also receive an activation signal from a remote input device 94 via communication link 93. Communication link 93, like above-discussed communication link 91, can be any type of communication link which can communicate an activation signal sent from remote input 94 to test module 16. Input 94 can be, for example, a remotely located push-button activation device that can provide the activation signal, via communication link 93, to test module 16. In some aspects, remote input 94 may provide the activation signal automatically when a vehicle that contains storage battery 10 is started or stopped. The activation signal may be in the form of an RF signal, an IR signal, an audio signal, digital signal, CAN bus signal, LIN bus signal, etc. Remote input 94 may be located in a driver cabin of a vehicle in which battery 10 is installed, on a dashboard of a vehicle in which the battery is installed, etc. Input 20/26 may include a timing controller configured to apply the activation signal after a predetermined time period. Also, remote input 94 may include such a timing controller that can apply the activation signal after a predetermined time period. Test module 16 can also provide historical battery condition information to remote output device 92 via communication link 91. In some embodiments of the present invention, test module 16, communication links 91 and 93, remote output device 92 and remote input 93 are part of an apparatus for testing a storage battery.

Figure 8:
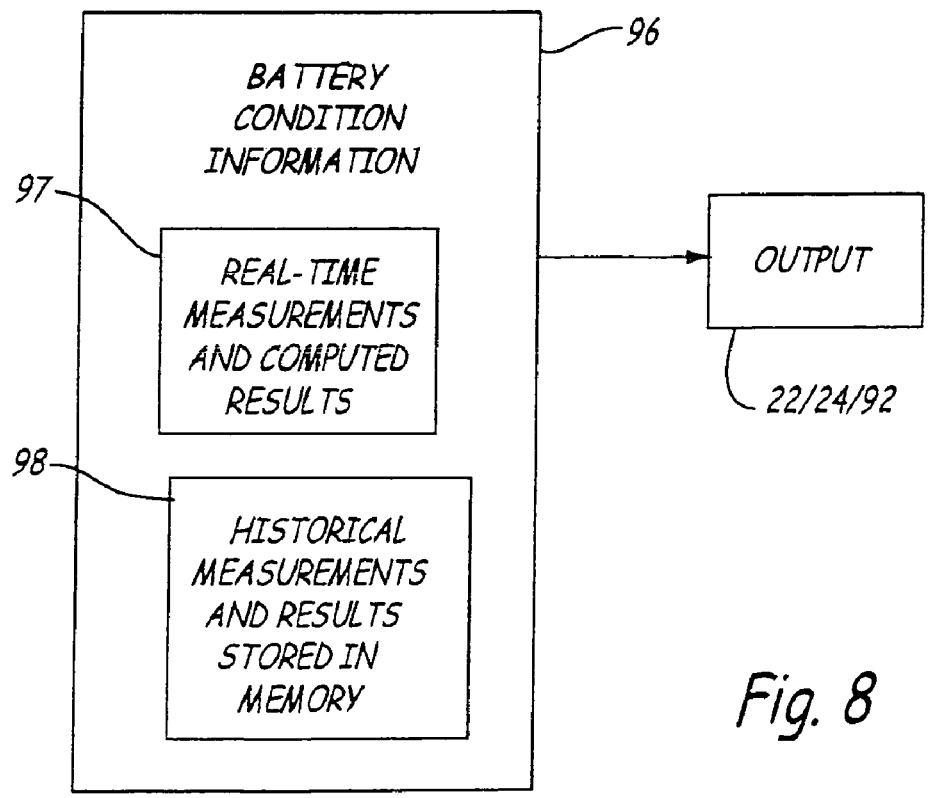
FIG. 8 is a block diagram illustrating various types of battery test condition information provided by the battery test module.

FIG. 8 is a block diagram illustrating contents of battery condition information provided to different outputs. As illustrated in FIG. 8, battery condition information 96 includes real-time measurements (battery current, voltage measurement, etc.) and computed results represented by block 97, and measurements and results stored in memory 44, represented by block 98. Battery test module 16 can provide battery condition information 96 to different outputs, such as 22, 24 and 92.

Figure 9:
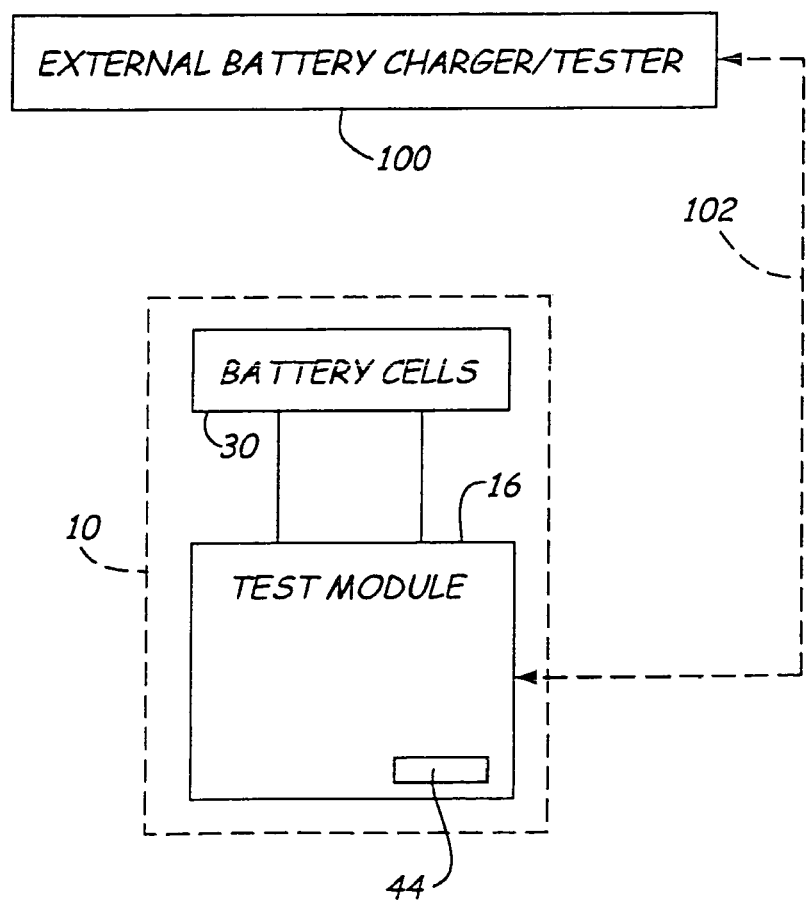
FIG. 9 is a simplified block diagram of a storage battery with a battery test module that can communicate with an external charger/tester in accordance with an embodiment of the present invention.

FIG. 9 illustrates a storage battery with an integrated battery test module in accordance with an embodiment of the present invention. A number of items illustrated in FIG. 9 are similar to those shown in FIGS. 1-7 and are similarly numbered. In addition, FIG. 9 shows an external battery charger/tester 100 with which test module 16 can communicate via communication link 102. One example battery charger/tester, similar to charger/tester 100, is set forth in U.S. Pat. No. 6,104,167, issued Aug. 15, 2000, and entitled "METHOD AND APPARATUS FOR CHARGING A BATTERY" which is incorporated herein by reference. Communication link 102 may be any hard wired or wireless link, such as those described in connection with communication links 91 and 93 (FIG. 7) and can transfer battery condition information from test module 16 to external battery charger/tester 100. Additionally, data from external battery charger/tester 100 can be received by test module 16 via communication link 102. In some aspects, battery condition information includes a warranty code for storage battery 10. The warranty code can be determined by either test module 16 or external battery charger/tester 100. In addition, battery test module 16 can send historical battery condition information from memory 44 to external battery charger/tester 100. As mentioned above, this historical information can be utilized to monitor usage of the battery and to maintain a record of various events in the life of the battery. In embodiments of the present invention, battery test module 16 can implement one or more computational algorithms which are substantially similar to, and compatible with computational algorithms included in external battery charger/tester 100. In some aspects, the compatible computational algorithms are capable of determining the state of charge and state of health of storage battery 100. Such compatibility of computational algorithms allows for an exchange of intermediate computations or results between the test module 16 and external battery charger/tester 100. These exchanged intermediate computations or results can be utilized by test module 16 and external battery charger/tester 100 to carry out additional computations.

In the embodiments of the present invention described above, the test module has been described as a device that can releasably attach to the battery under bolts on the battery posts, for example, or be substantially permanently attached to the battery. In such embodiments, the battery test module typically includes a rigid printed circuit board (PCB) with electronic components mounted on the PCB and is therefore relatively large. Retooling of the battery case or housing is typically required to integrate such a battery test module with the battery housing. Further, since batteries are classified into group sizes based on external dimensions, the addition of the relatively large battery test module could affect the group size dimensions of the battery. Thus, although such a battery test module has several advantages over prior art battery testers, which are pieces of equipment separate from the battery, it can be relatively costly to manufacture and install. An embodiment of the present invention that can be affixed to a battery of any group size without retooling the battery case or affecting the group size dimensions of the battery is described below in connection with FIG. 10.

Figure 10:
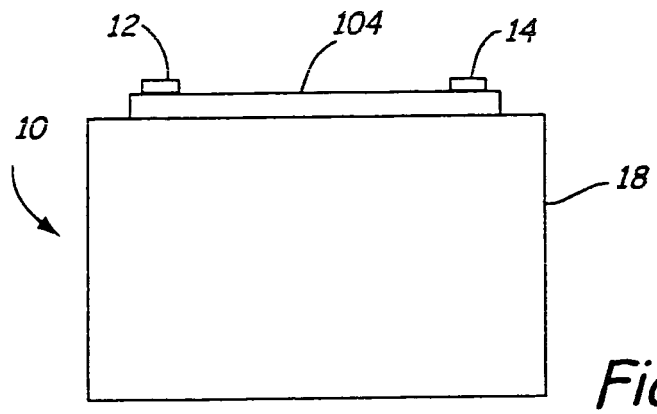
FIG. 10 is a side plan view of the storage battery upon which the battery test module is affixed.

FIG. 10 is a side plan view of storage battery 10 upon which battery test module 104 is affixed. In this embodiment of the present invention, the components included in battery test module 104 function in a manner substantially similar to the components of battery test module 16. However, battery test module 104 is formed using flexible circuit and/or flipped chip technology and therefore test module 104 is a flexible "battery label" with embedded electronic components. Thus, test module 104 can be manufactured in one size and can be affixed to a top surface an sides of a housing of a battery of any group size. Further, since test module 104 is a relatively thin label, the dimensions and therefore the group size of the battery to which it is affixed are not altered. Due to the above-mentioned advantages, battery test module 104 can be produced at a relatively low cost and in very high volume. A technique for mechanically and electrically coupling test module 104 to battery 10 is described below in connection with FIG. 11.

Figure 11:
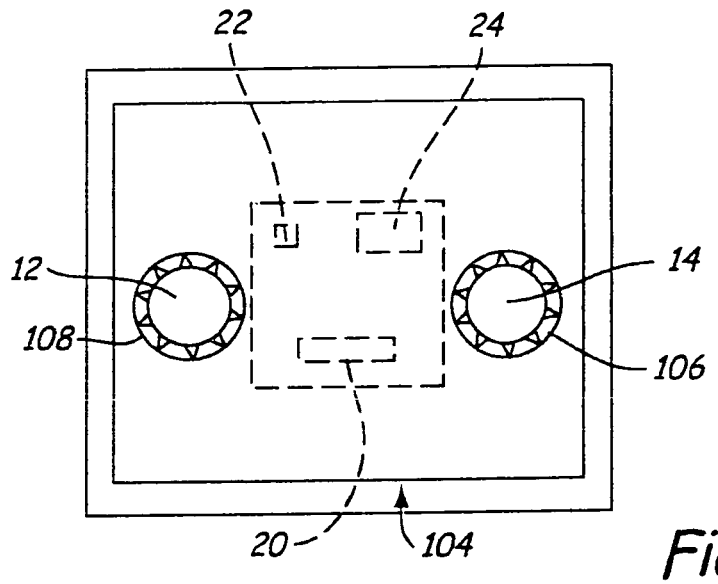
FIG. 11 is a top plan view of the storage battery of FIG. 10.
Figure 12:
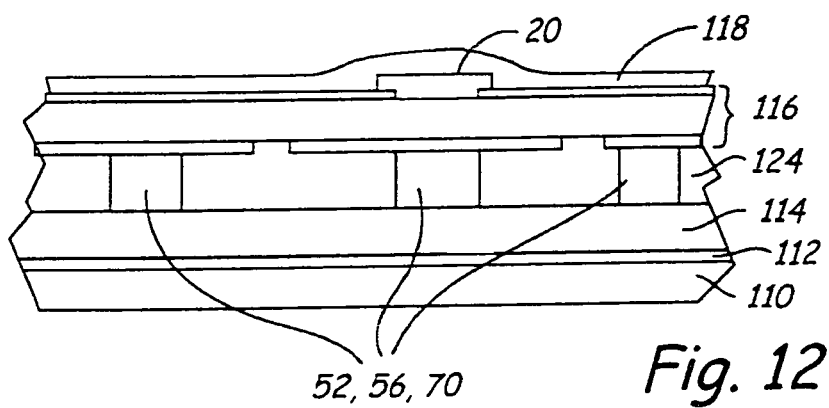
FIG. 12 illustrates a cross section of a portion of the test module.

FIG. 11 is a top plan view of storage battery 10 of FIG. 10. As can be seen in FIG. 11, battery test module 104 includes components similar to those included in test module 16 (FIG. 2A). However, as mentioned above, test module 104 is formed of multiple flexible layers. Battery test module 104 is coupled to battery posts 12 and 14 with the help of a "trap" configuration, pointed to by numerals 106 and 108, to fit over the battery posts 12 and 14. Post or terminal grasping portions 106 and 108 comprise grooves in battery test module 104, with electrically conductive teeth protruding into the grooves to make electrical contact with posts 12 and 14. Portions of battery test module 104 may be substantially elastic to enable coupling of test module 104 to posts of batteries of different dimensions. A bottom surface of test module 104 may be affixed to the top surface of battery 10 with the help of any suitable adhesive. In some embodiments, a first portion of battery test module 104 may be affixed to the top surface of the battery housing and the remaining portion(s) of test module 104 may be bent and affixed to sides of the housing. In some embodiments of the present invention, battery test module 104 is sufficiently thin and flexible such that it is capable of conforming to irregularities on an outer surface (top and sides) of the battery housing. In one embodiment of the present invention, battery test module 104 is substantially permanently affixed to the housing of battery 10. In some embodiments, battery test module 104 may be temporarily affixed or selectively removable from the housing of battery 10. FIG. 12 illustrates a cross-section of a portion of an example embodiment of test module 104. As can be seen in FIG. 12, test module 104 is a multi-layered structure that includes a heat spreader layer 110, an adhesive layer 112, a flexible substrate 114, a flex circuit 116 and a protective layer 118. Components such as push button 20, which is used to activate test module 104 to conduct a battery test, are included on a top surface of flex circuit 116, and components such as operational amplifiers 52 and 70 and microprocessor 56 are included on a bottom surface of flex circuit 116 and are supported by flexible substrate 114 and encapsulant 124. Encapsulation of components such as amplifiers 52 and 70 and microprocessor 56 improves the robustness of test module 104 and reduces stress on the components. Components such as amplifiers 52 and 70 and microprocessor 56 may be mounted on flex circuit 116 using flip chip technology, surface mount technology, or other techniques as are known in the industry or are developed in the future. The use of flip chip technology for mounting such components is described in U.S. Pat. No. 6,410,415 entitled "FLIP CHIP MOUNTING TECHNIQUE," which is herein incorporated by reference. Flex circuit 116 is a multi-layered structure upon which some components such as resistors and push buttons (such as 20) are formed by additive or subtractive fabrication processes and, as mentioned above, other components (such as amplifiers 52 and 70 and microprocessor 56) are mounted. An example process for fabricating a flex circuit is described in U.S. Pat. No. 6,150,071 entitled "FABRICATION PROCESS FOR FLEX CIRCUIT APPLICATIONS," which is herein incorporated by reference.

The embodiment of test module 104 described in connection with FIG. 12 is only an example embodiment of the present invention. It should be noted that a different number of layers and different types of layers may be employed, components (such as 20, 52, 56 and 70) may be positioned on different layers and any suitable material or combination of materials may be employed for each layer without departing from the spirit and scope of the invention.

Figure 13A:
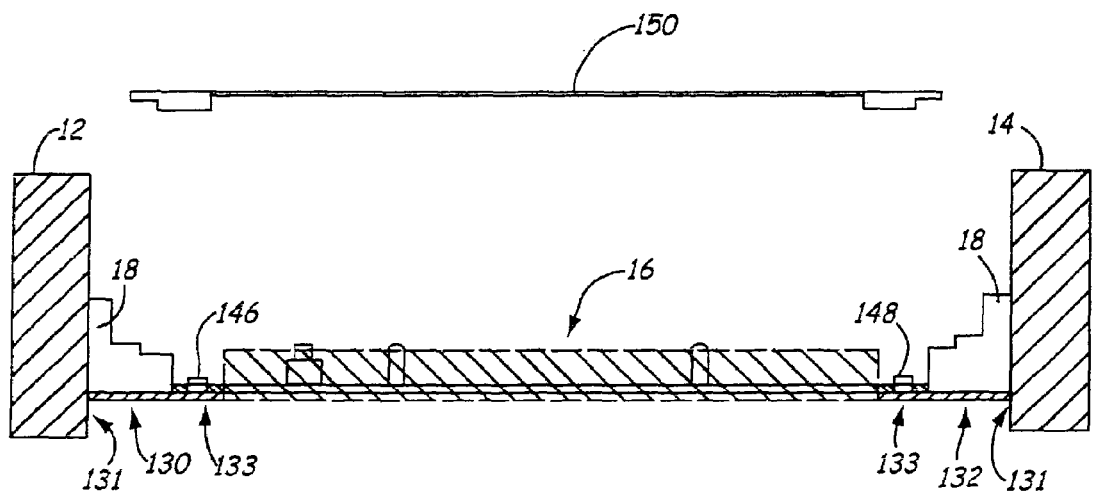
FIG. 13A illustrates a cross section of a portion of the battery.
Figure 13B:
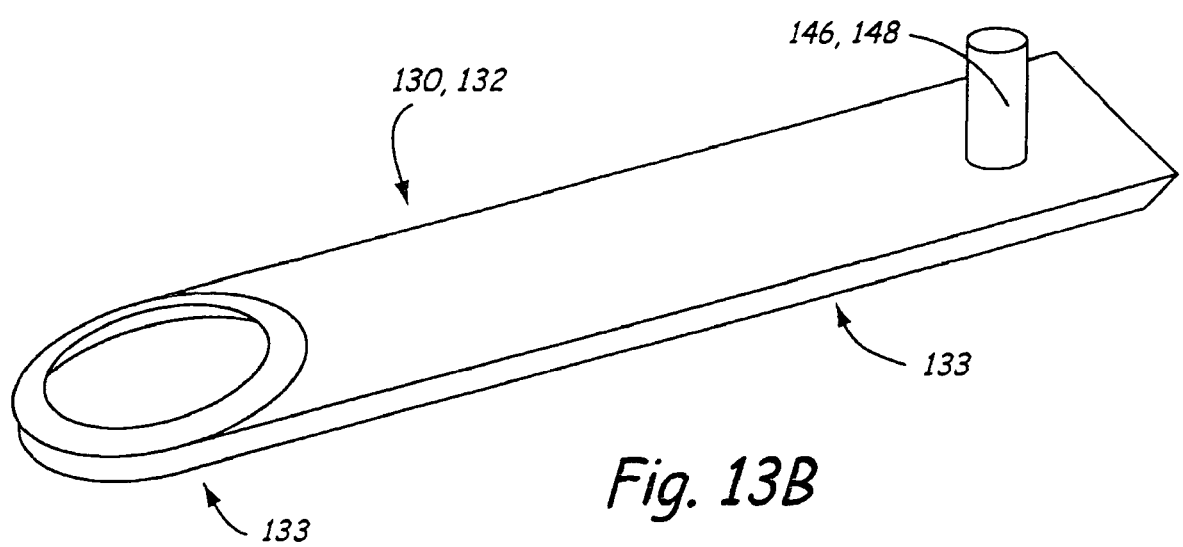
FIG. 13B illustrates a battery post extension in accordance with an embodiment of the present invention.

FIG. 13A illustrates a cross-section of a portion of battery 10 on which battery test module 16, 104 is mounted. As illustrated in FIG. 13A, test module 16, 104 couples to battery posts 12 and 14 via post extensions 130 and 132. Each post extension 130, 132 is an electrically conductive plate member having a proximal end 131 coupled to battery post 12, 14 and a distal portion 133 that includes a raised member 146, 148 that is configured to fit into grooves such as 142 and 144 (FIG. 14) in battery test module 16, 104. Proximal end 131 of post extension 130, 132 may be formed integral with post 12, 14, during manufacture of battery 10, or may be annular in configuration to slidably engage with post 12, 14 (FIG. 13B). The embodiment of post extension 130, 132 shown in FIG. 13B is formed separate from post 12, 14 and can be installed on post 12, 14 subsequent to battery manufacture. In the embodiment shown in FIG. 13A, post extension 130, 132 is shown as being recessed in battery housing 18. However, in some embodiments, post 130, 132 may be positioned external to battery housing 18. In some embodiments of the present invention, although proximal end 131 is formed integral with distal portion 133, each of these portions may be formed from a different conductive material. For example, proximal end 131 may be formed of a conductive metal such as copper or brass to ensure good mechanical and electrical coupling between post 12, 14 and post extension 130, 132, and distal portion 133 may be made of lead. Raised member 146, 148 may be formed of a metal, such as lead, which can be melted after raised member 146, 148 is fit into groove 142, 144 to provide, upon cooling, secure mechanical coupling between test module 16, 104 and post extension 130, 132. A cover 150 may be employed to protect battery test module 16, 104 and exposed portions of post extensions 130 and 132.

Figure 14:
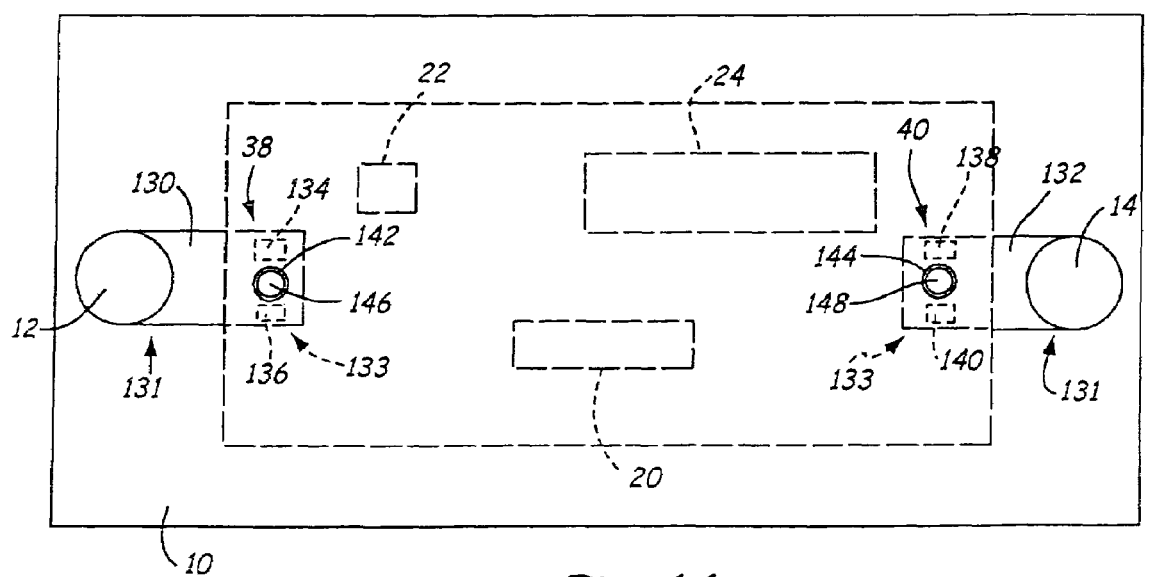
FIGS. 14 and 15 are top plan views of storage battery showing different embodiments of battery post extensions.

FIG. 14 is a top plan view of storage battery 10 showing Kelvin electrical connections 38 and 40 between test module 16, 104 and post extensions 130 and 132. As a result of coupling test module 16, 104 to battery post extension 130, 132 as described above, conductive pads 134 and 136, 138 and 140, which are included on a bottom surface of test module 16, 104, are urged against post extension 130, 132 to form Kelvin connection 38, 40.

Figure 15:
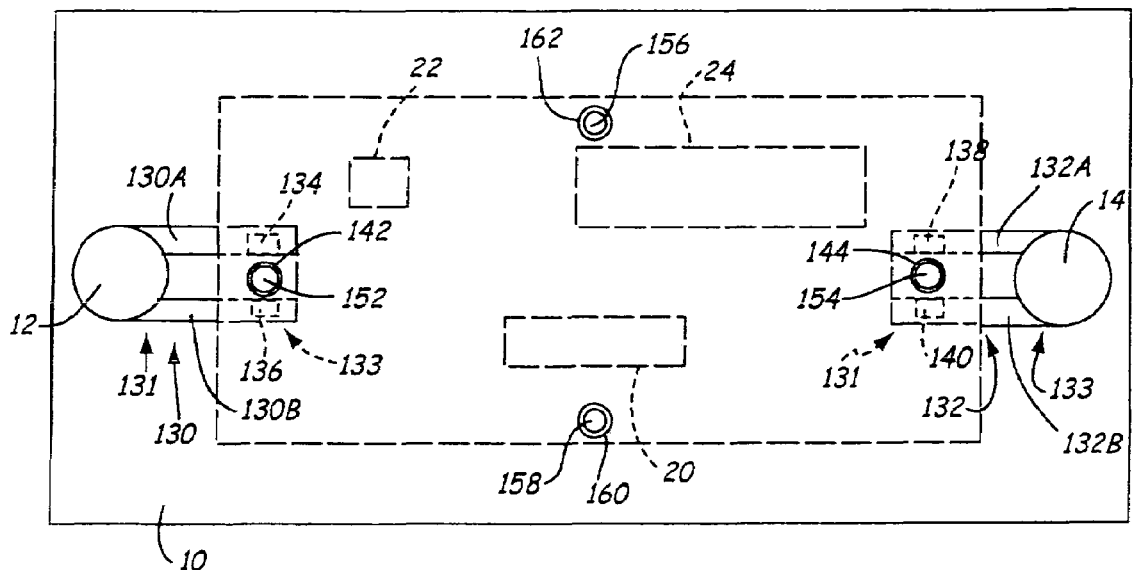

In the embodiment of the present invention shown in FIG. 15, instead of distal portion 131 of post extension 130, 132 being a flat plate member, arms 130A and 130B, 132A and 132B that connect to pads 134 and 136, 138 and 140 to form Kelvin connections 38, 40 are employed. In some embodiments, arms 130A and 130B, 132A and 132B may be soldered to conductive pads 134 and 136, 138 and 140. In some embodiments, post extension 130, 132 may be formed integral with test module 16, 104 and subsequently coupled to post 12, 14. Raised members 146 and 148 are not included in this embodiment. Therefore, mechanical coupling between battery test module 16, 104 and battery 10 is carried out using fasteners (such as 152, 154, 156 and 158), attached to the top surface of battery housing 18, which are fit into grooves such as 142, 144, 160 and 162 in battery test module 16, 104. Fasteners (such as 152, 154, 156 and 158) may be melt caps 170 (FIG. 16-1), screw standoffs 174 (FIG. 16-2) that receive screws or snap tabs 176. Melt cap 170 includes an extended portion 172 that can be melted and cooled after melt cap 170 is fit into a groove (such as 142, 144, 160 and 162) to provide secure mechanical coupling between test module 16, 104 and battery 10.

The embodiments of test module 16, 104 coupled to battery 10 through post extensions 130 and 132 described in connection with FIGS. 113A-16 are only example embodiments of the present invention. It should be noted that any suitable material or combination of materials may be employed for proximal end 131 and distal portion 133 of post extensions 130, 132. Further, proximal end 131 and distal portion 133 may be of any suitable shape without departing from the spirit and scope of the invention. Also, any suitable fastener may be employed to attach battery test module 16, 104 to the housing of battery 10.

In embodiments of the present invention, described above, push button 20 is used to manually activate test module 16, 104 to conduct a battery test. However, embodiments of the present invention, described below in connection with FIGS. 17 through 19, can automatically carry out a battery test under certain predetermined conditions.

Figure 17:
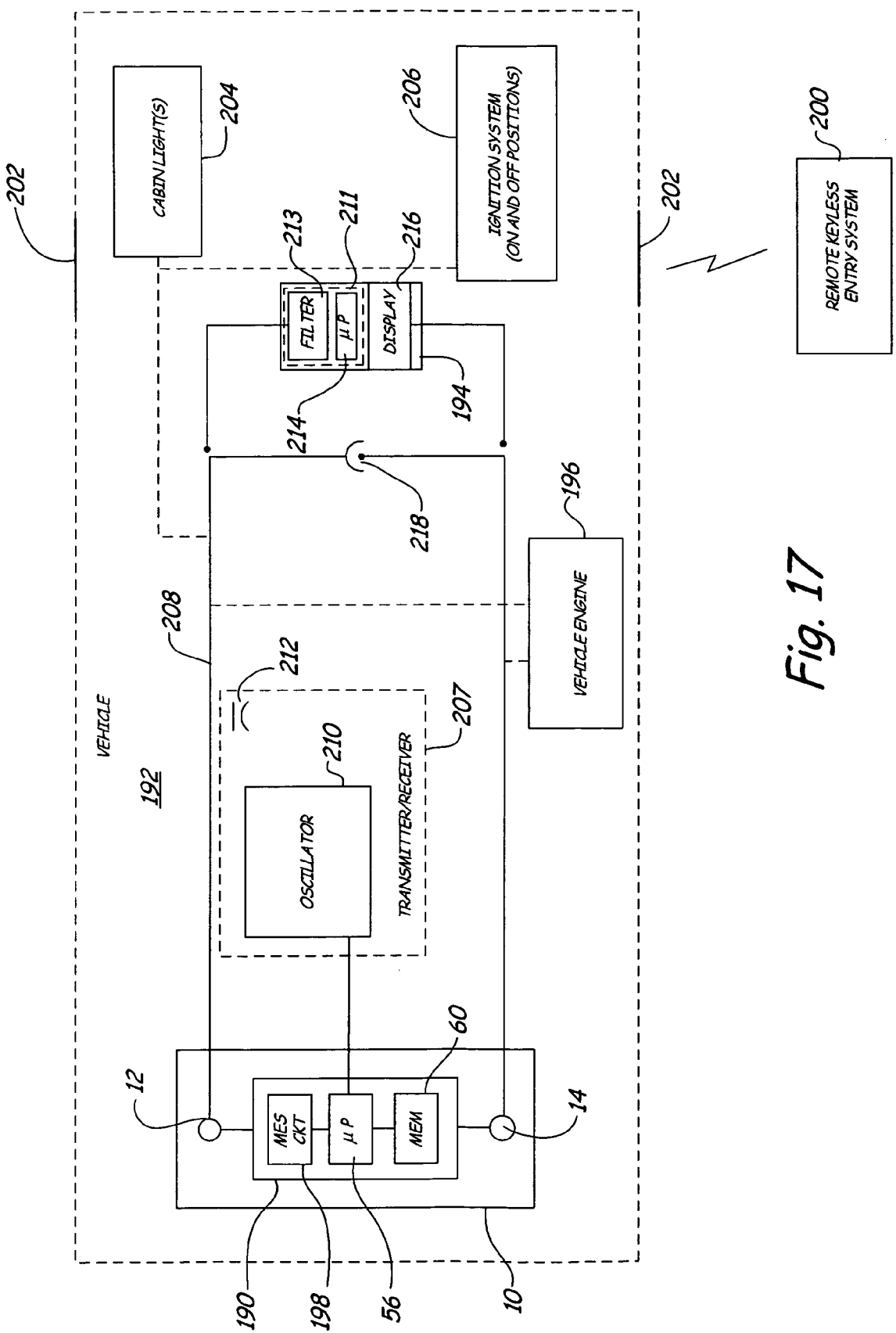
FIG. 17 is a simplified block diagram of a vehicle that includes a battery test module that can automatically test a battery when its voltage drops below a predetermined threshold.

FIG. 17 is a simplified block diagram of a vehicle that includes a battery test module 190 that can automatically test a battery when its voltage drops below a predetermined threshold, for example, in accordance with an embodiment of the present invention. Module 190 contains components substantially similar to those included in earlier-described battery test modules 16 and 104. However, microprocessor 56 of module 190 is also configured to automatically carry out a battery test when the battery voltage falls below a predetermined threshold.

As can be seen in FIG. 17, battery test module 190 is attached to terminals 12 and 14 of vehicle battery 10. Module 190 automatically tests vehicle battery 10 and transmits data (test results, for example) to another module (an output device 194, for example) in vehicle 192. In essence, using battery test module 190, periodic battery tests can automatically be performed without opening a hood (not shown) of vehicle 192. No buttons are necessary in battery test module 190 as long as it is preprogrammed with battery ratings. No LED or status displays are required either. Of course, these features can optionally be included in module 190.

Although battery module 190 is shown attached outside of battery 10, it can also be embedded inside battery 10. Battery test module/monitor 190 may include a rigid PCB with electronic components mounted on the PCB, or may include flex circuits with embedded components. Module 190 may be coupled to battery 10 using any of the earlier-described coupling/mounting techniques.

Battery monitor 190, as mentioned above, senses when to test battery 10 and can also determine when to transmit battery test results or battery condition information. In embodiments of the present invention, vehicle engine 196 should be off when a battery test is carried out. In such embodiments, monitor 190 is configured to sense when vehicle engine 196 is off by comparing battery DC and AC voltages to set thresholds. For example, 13.5V or 14V are typical regulator voltages when engine 196 is running. Monitor 190 is configured not to test battery 10 when these high voltages are sensed. When the voltage drops below about 13V, monitor 190 waits 15 minutes, for example, and then runs a battery test. Of course, the wait period before the test is conducted is optional. In general, predetermined/set voltage threshold values can be stored in memory 60 and utilized by microprocessor 56 to carry out comparisons with voltage values measured by measurement circuitry 198. When the comparisons indicate that battery voltage has dropped below the set voltage threshold, a battery test is conducted under the control of microprocessor 56. Data indicating a condition of battery 10 is stored in memory 60.

In embodiments of the present invention, microprocessor 56 of monitor 190 is programmed to sense a sudden small drop in voltage that occurs when a remote keyless entry device 200 unlocks doors 202 or when cabin lights 204 come on when one or more doors 202 are opened, or when an ignition key 206 is turned to an on position before starting. Voltage sensing can be carried out using low current drain techniques to minimize charge loss. In these embodiments, monitor 190 runs a battery test and stores a latest result set in memory 60 for future transmission. Of course, test results can also be substantially immediately transmitted.

One relatively low cost method of transferring data to another module or display is by using serial data transfer through wires. However, wiring batteries to a module in a passenger compartment or cabin is relatively difficult. Thus, in embodiments of the present invention, data is transmitted to another module through a battery power line (such as 208). This method of data transfer requires no additional wires or RF antennas. Communication circuitry (transmitter/transceiver 207) including an oscillator 210 (preferably a high frequency oscillator), which can be keyed on and off by microprocessor 56 is employed to help transfer data. For simplification, transmitter/transceiver 207 is shown separate from module 190. However, in embodiments of the present invention transmitter/transceiver 207 can be a part of microprocessor circuit 56 of module 190. As can be seen in FIG. 17, oscillator 210 is coupled to battery positive supply line 208 using a capacitor 212. In some embodiments, oscillator 210 outputs a signal of a first frequency to represent a digital 0 and outputs a signal of a second frequency to represent a digital 1. In other embodiments, a single frequency output by oscillator 210 is used. Here, the presence of the single set frequency is a digital 1 and the absence is a digital 0. This is referred to as on off keying. Other transmission methods may also be used. As mentioned above, monitor 190 detects when a vehicle starts by measuring voltage and/or ripple. Further, as noted above, data stored in memory 60 can be transmitted several times or continuously while vehicle 192 is running. For example, data stored in memory 60 can be transmitted when the battery voltage is at least equal to an engine-running voltage threshold value (13.5V, for example).

As can be seen in FIG. 17, a receiver 211 including a filter 213 (band pass filter, for example) is coupled to battery positive power line 208 to receive the transmitted data. Data output by filter 213 is decoded using a microprocessor 214 and provided to a display 216. Display 216 can be placed anywhere in vehicle 192 by only connecting power and ground. For simplification, filter 213, microprocessor 214 and display 216 are shown as a single output unit 194 in FIG. 17. However, as mentioned above, individual components of output unit 194 can be positioned in different locations within vehicle 192. In embodiments of the present invention, display 214 (which can be a relatively simple LED display) is configured to be plugged into a cigarette lighter connector 218. In some embodiments, output unit 194 may be part of a vehicle system or even part of a diagnostic tool that is external to vehicle 192. In such embodiments, a separate display unit 214 may not be necessary.

For simplification, vehicle 192 is shown as including a single battery 10 with a single monitor 190. However, it should be noted that the teachings of the present invention are also applicable to vehicles having multiple batteries. For a vehicle employing multiple batteries, each battery would include a separate test module (such as 190). Using the techniques described above, each separate battery test module would automatically test the respective battery upon sensing a drop in battery voltage below the predetermined threshold level and transmit condition information of the respective battery to an output similar to unit 194. The output unit would be capable of receiving and, if necessary, displaying condition information for the different batteries. Unique identification information would accompany condition information for each battery test module.

Figure 18:
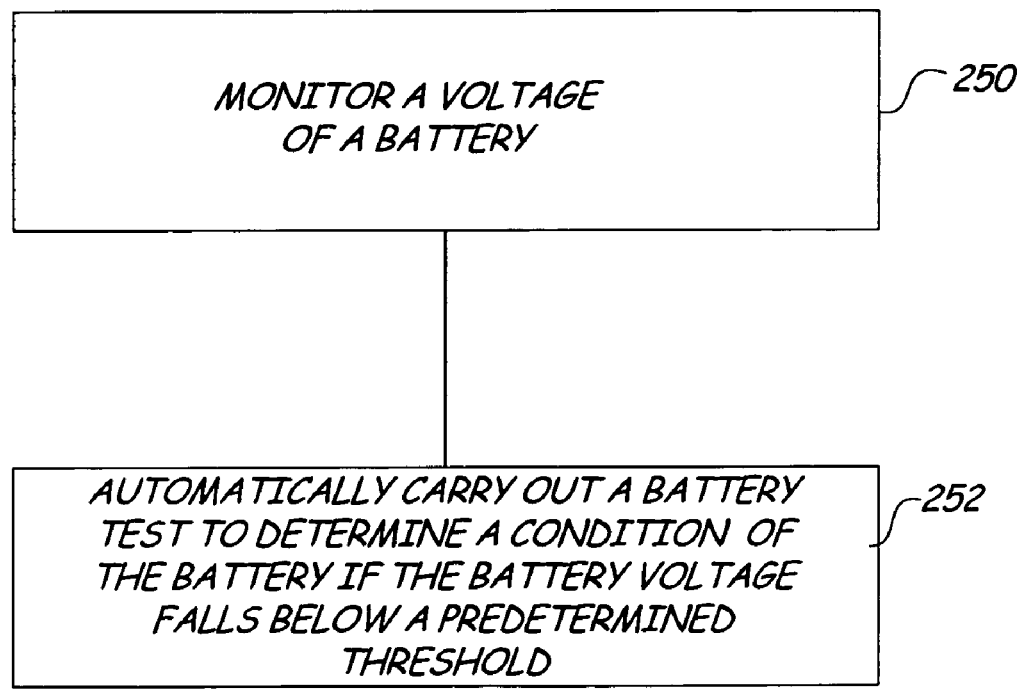
FIG. 18 is a flowchart of a method of testing a storage battery in accordance with an embodiment of the present invention.

FIG. 18 is a flowchart of a method of testing a storage battery in accordance with an. embodiment of the present invention. At step 250, a voltage of the battery is monitored. At step 252, a battery test is automatically carried out to determine a condition of the battery if the battery voltage falls below a predetermined threshold. Different techniques, some of which are set forth above, can be employed to carry out the steps shown in the above-described flowchart while maintaining substantially the same functionality without departing from the scope and spirit of the present invention.

The above-described method of monitoring batteries and transmitting data through a battery power line is useful in a number of different battery applications. One example use for this method is in battery banks.

Banks of storage batteries are used in various applications including backup power supply applications. For example, remote cellular stations, electrical switching stations, hospitals, and many other installations require a source of backup power. In many such installations, it is important to ensure that the battery or batteries have not degraded and are capable of maintaining a desired amount of charge.

In the past, a technician has been typically required to perform battery tests on each of the batteries at the installation. This can be by manually connecting a battery tester to each of the batteries and taking measurements of the batteries. In another example configuration, test connections are run out to each of the batteries and connected to a central location. This allows the testing procedure to be automated, but requires a large amount of additional wiring for coupling individual cells/batteries together to a controller.

Since battery monitors of the present invention are capable of monitoring batteries and transmitting data through battery power lines, the above-mentioned additional wiring is not needed. Details regarding monitoring individual batteries of a battery bank in accordance with embodiments of the present invention are provided below in connection with FIG. 19.

Figure 19:
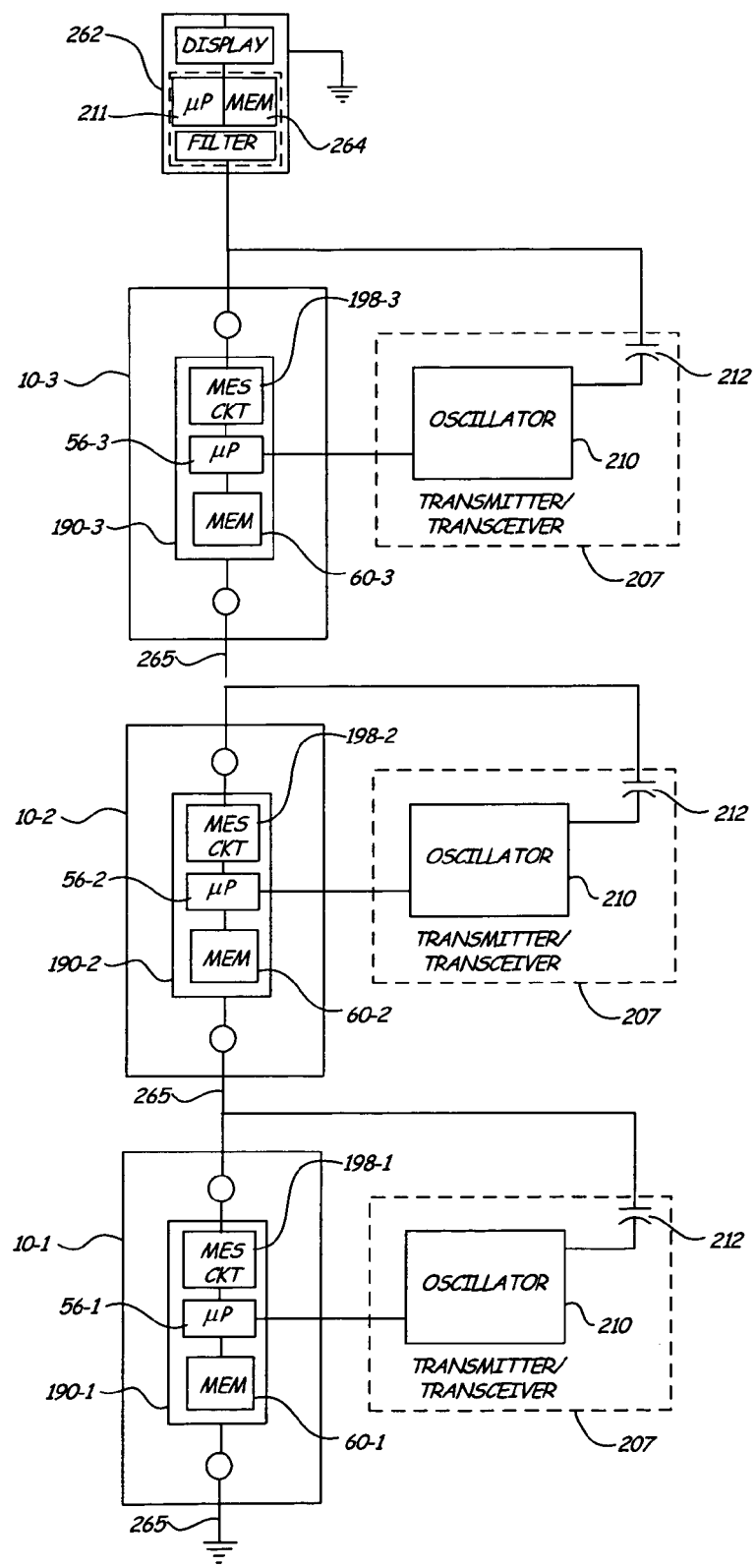
FIG. 19 is a simplified block diagram of a battery bank employing battery test modules of the present invention.

FIG. 19 shows an example battery bank 220 including batteries 10-1, 10-2 and 10-3 that include battery monitors 190-1, 190-2 and 190-3, respectively. Each battery monitor 190-1, 190-2, 190-3 is similar to battery monitor 190 of FIG. 17 and therefore includes a microprocessor 56-1, 56-2, 56-3, a memory 60-1, 60-2, 60-3, and a measurement circuit 198-1, 198-2, 198-3. A combination of a microprocessor 56-1, 56-2, 56-3, and a measurement circuit 198-1, 198-2, 198-3 is referred to as a test circuit. Also included in the monitoring system of FIG. 18 is a central control unit 262, which is similar to output unit 194 of FIG. 17. Each battery monitor 190-1, 190-2, 190-3 is configured to carry out battery tests at different times, for example, on the respective battery (of battery bank 220) on which it is mounted. Central control unit 262 is utilized to display battery test results from each of battery monitors 190-1, 190-2 and 190-3. Since batteries 10-1, 10-2 and 10-3 are electrically coupled together, data from individual battery monitors 190-1, 190-2 and 190-3 can be transmitted through battery connection cables 265, in the manner described earlier in connection with FIG. 17, using communication circuitry (transmitter(s)/transceivers(s) 207 comprising oscillator(s) 210 and capacitors(s) 212) to central control unit 262. Thus, a single, relatively cheap, unit may be utilized for displaying test results for each battery of a battery bank (such as 220).

In standby or backup power supply applications, battery monitors 190-1, 190-2 and 190-3 are configured to run battery tests periodically, either self timed or when requested by central control unit 262, only when batteries 10-1, 10-2 and 10-3 are on float charge. In standby applications, a drop in battery voltages usually indicates that normal power from an alternating current (AC) source is disconnected and the battery bank is being used to maintain power. High current is being drawn from individual batteries 10-1, 10-2, 10-3 at this time and therefore testing the batteries 10-1, 10-2 and 10-3 would give erroneous results.

Each module 190-1, 190-2, 190-3 includes identification information (such as a unique identification code for each module (190-1, 190-2, 190-3), a serial number of the corresponding battery (10-1, 10-2, 10-3), etc.), which uniquely identifies the module that performed the test or battery from which the battery test information was obtained. The respective identification information is sent along with the corresponding test results to central control unit 126 using similar high frequency over direct current (DC) power line methods described above in connection with FIG. 17. Identification information for each module 190-1, 190-2, 190-3 is stored in the respective memory 60-1, 60-2, 60-3 of the module.

In embodiments of the present invention, a copy of the identification information for each battery/test module is stored in memory 264 of central control unit 262. The identification information for each battery/test module 190-1, 190-2, 190-3 can be input into central control unit 262 using any suitable method. When transmitted information from modules 190-1, 190-2 and 190-3 is received at central control unit 262, microprocessor 211 carries out a verification process, which includes a comparison between the transmitted identification information and the corresponding identification information stored in memory 264. The test results are then displayed by unit 262 or transmitted to another computerized system.

Although the present invention has been described with reference to preferred embodiments, workers skilled in the art will recognize that changes may be made in form and detail without departing from the spirit and scope of the invention. Although battery 10, 10-1, 10-2, 10-3 is described as including a plurality of electrochemical cells, in some embodiments of the present invention, battery 10, 10-1, 10-2, 10-3 can consist of only a single electrochemical cell.

What is claimed is:

1. A storage battery comprising:
   a battery housing;
   a plurality of electrochemical cells in the battery housing electrically connected in series to a positive terminal of the battery and a negative terminal of the battery;
   a first Kelvin connection coupled to the positive terminal of the battery;
   a second Kelvin connection coupled to the negative terminal of the battery; and
   a battery test module mounted to the battery housing and electrically coupled to the positive and negative terminals through respective first and second Kelvin connections, wherein the battery test module is configured to automatically carry out a battery test when a voltage across the battery falls below a predetermined threshold, and wherein the battery test module is configured to automatically carry out the battery test by applying, when the voltage across the battery falls below the predetermined threshold, a signal to the storage battery through the first Kelvin connection and the second Kelvin connection, wherein the battery test module is integrated with the storage battery, and wherein the battery test is carried out automatically in response to real-time battery voltage measurements carried out by the integrated battery test module independently of any testing of external components that may be connected to the storage battery.

2. The apparatus of claim 1 wherein the predetermined threshold is a function of a drop in battery voltage associated with unlocking doors of a vehicle, that includes the battery, using a remote keyless entry system.

3. The apparatus of claim 1 wherein the predetermined threshold is a function of a drop in battery voltage associated with a cabin light of a vehicle, that includes the battery, being turned on as a result of at least one door of the vehicle being opened.

4. The apparatus of claim 1 wherein the predetermined threshold is a function of a drop in battery voltage associated with turning an ignition key of a vehicle, that includes the battery, to an on position.

5. The apparatus of claim 1 wherein the battery test module is configured to automatically carry out the battery test when the voltage across the battery remains below the predetermined threshold for a predetermined wait period.

6. The apparatus of claim 1 wherein the battery test module is configured to provide battery condition information to a remote output module.

7. The apparatus of claim 6 wherein the battery test module is configured to provide the battery condition information to the remote output module via a battery power line coupled to one of the first and second Kelvin connections.

8. The apparatus of claim 6 wherein the battery condition information is transmitted using a oscillator.

9. The apparatus of claim 8 wherein the transmitted information is filtered in the output module.

10. The apparatus of claim 1 wherein the battery test module is further configured to store battery condition information for subsequent transmission to a remote output module.

11. The apparatus of claim 10 wherein the battery test module is further configured to transmit the stored battery condition information to the remote output module when the battery voltage is at least equal to an engine-running voltage threshold value.

12. A method of testing a storage battery, the method comprising:

monitoring a voltage of the storage battery using a battery test module integrated with the storage battery; and automatically conducting a battery test if the battery voltage falls below a predetermined threshold using the battery test module integrated with the storage battery, wherein automatically conducting the battery test comprises applying, when the battery voltage falls below the predetermined threshold, a signal from the battery test module to the storage battery through a first Kelvin connection and a second Kelvin connection and, based on a response of the storage battery to the applied signal, outputting battery condition information from battery test module integrated with the storage battery;

wherein monitoring the voltage of the storage battery and automatically conducting the battery test if the battery voltage falls below a predetermined threshold are carried out by the integrated battery test module independently of any testing of external components that may be connected to the storage battery.

13. The method of claim 12 and further comprising providing battery condition information to a remote output module.

14. The method of claim 13 and further comprising providing the battery condition information to the remote output module via a battery power line coupled to terminals of the battery.

15. The method of claim 14 and further comprising transmitting the battery condition information using a oscillator.

16. The method of claim 15 and further comprising filtering the transmitted information in the output module.

17. The method of claim 12 and further comprising automatically carrying out the battery test when the voltage across the battery remains below the predetermined threshold for a predetermined wait period.

18. A battery monitoring system, comprising:

a first electronic battery tester mounted to a housing of a first storage battery, the first electronic battery tester comprising:

a first test circuit configured to test the first storage battery and to generate test data corresponding to the first storage battery; and a first memory configured to store a first identifier;

a second electronic battery tester mounted to a housing of a second storage battery, the second electronic battery tester comprising:

a second test circuit configured to test the second storage battery and to generate test data corresponding to the second storage battery;

a second memory configured to store a second identifier; and communication circuitry configured to transmit the test data, corresponding to the first storage battery, and the first identifier via a battery power line, and further configured to transmit the test data, corresponding to the second storage battery, and the second identifier via the battery power line.

19. The apparatus of claim 18 and further comprising a central control unit configured to receive the test data, corresponding to the first storage battery and the second storage battery, and the first and second identifier, over the battery power line.

20. The apparatus of claim 18 wherein the first test circuit is configured to test the first storage battery and the second test circuit configured to test the second storage battery when the respective first and second storage batteries are at a float voltage.

* * * * *